(12) United States Patent
Ozawa et al.

(10) Patent No.: US 11,587,626 B2
(45) Date of Patent: Feb. 21, 2023

(54) SEMICONDUCTOR STORAGE DEVICE

(71) Applicant: Kioxia Corporation, Tokyo (JP)

(72) Inventors: Toru Ozawa, Kamakura (JP); Kouji Nakao, Yokohama (JP); Yoichi Mizuta, Yokohama (JP); Kiyofumi Sakurai, Yokohama (JP); Youichi Magome, Kawasaki (JP); Yoshiaki Takahashi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/336,772

(22) Filed: Jun. 2, 2021

(65) Prior Publication Data

US 2022/0093186 A1    Mar. 24, 2022

(30) Foreign Application Priority Data

Sep. 18, 2020    (JP) .............................. JP2020-157802

(51) Int. Cl.
*G11C 16/00*    (2006.01)
*G11C 16/30*    (2006.01)

(52) U.S. Cl.
CPC .................................... *G11C 16/30* (2013.01)

(58) Field of Classification Search
CPC ........... G11C 16/30; G11C 5/063; G11C 7/04; G11C 16/0483; G11C 16/04; G11C 16/26; G11C 16/14; G11C 16/34; G11C 16/24; G11C 16/16; G11C 16/08; G11C 16/10; G11C 5/02; G11C 7/18; G11C 11/56; G11C 16/00; G11C 16/06; G11C 5/06; G11C 11/34; G11C 13/00; G11C 8/10
See application file for complete search history.

(56) References Cited

U.S. PATENT DOCUMENTS

2006/0056219 A1* 3/2006 Araki .................. H01L 23/5286
257/E23.153

FOREIGN PATENT DOCUMENTS

JP      2009-252806 A    10/2009

* cited by examiner

*Primary Examiner* — Thong Q Le
(74) *Attorney, Agent, or Firm* — Oblon, McClelland, Maier & Neustadt, L.L.P.

(57) ABSTRACT

A semiconductor storage device of an embodiment includes a wiring layer M1 and a wiring layer M2. The wiring layer M1 includes a signal line through which a data signal is transferred, and a plurality of dummy patterns formed of a material same as a material of the signal line. The wiring layer M2 includes a voltage supply line through which voltage Vdd is supplied and another voltage supply line through which voltage Vss is supplied. Each of the dummy patterns is electrically connected with any one of the voltage supply lines. In a dummy pattern disposed adjacent to the signal line, a surface facing the signal line is constituted by a first surface positioned at a first distance to the signal line and a second surface positioned at a second distance to the signal line, the second distance being different from the first distance.

8 Claims, 16 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2020-157802 filed on Sep. 18, 2020; the entire contents of which are incorporated herein by reference.

FIELD

Embodiments described herein relate generally to a semiconductor storage device.

BACKGROUND

A NAND flash memory is known as a semiconductor storage device.

DETAILED DESCRIPTION

A semiconductor storage device of the present embodiment is a semiconductor storage device including a first wiring layer and a second wiring layer. The first wiring layer includes a signal line through which a data signal is transferred and a plurality of dummy patterns formed of a material same as a material of the signal line. The second wiring layer includes a first voltage supply line through which first voltage is supplied and a second voltage supply line through which second voltage different from the first voltage is supplied. Each of the dummy patterns is electrically connected with any one of the first voltage supply line and the second voltage supply line. In an adjacent dummy pattern that is one of the dummy patterns and disposed adjacent to the signal line, a surface facing the signal line is constituted by a first surface positioned at a first distance to the signal line and a second surface positioned at a second distance to the signal line, the second distance being different from the first distance.

Embodiments will be described below with reference to the accompanying drawings.

First Embodiment

1. Configuration

1-1. Configuration of Memory System

Figure 1:
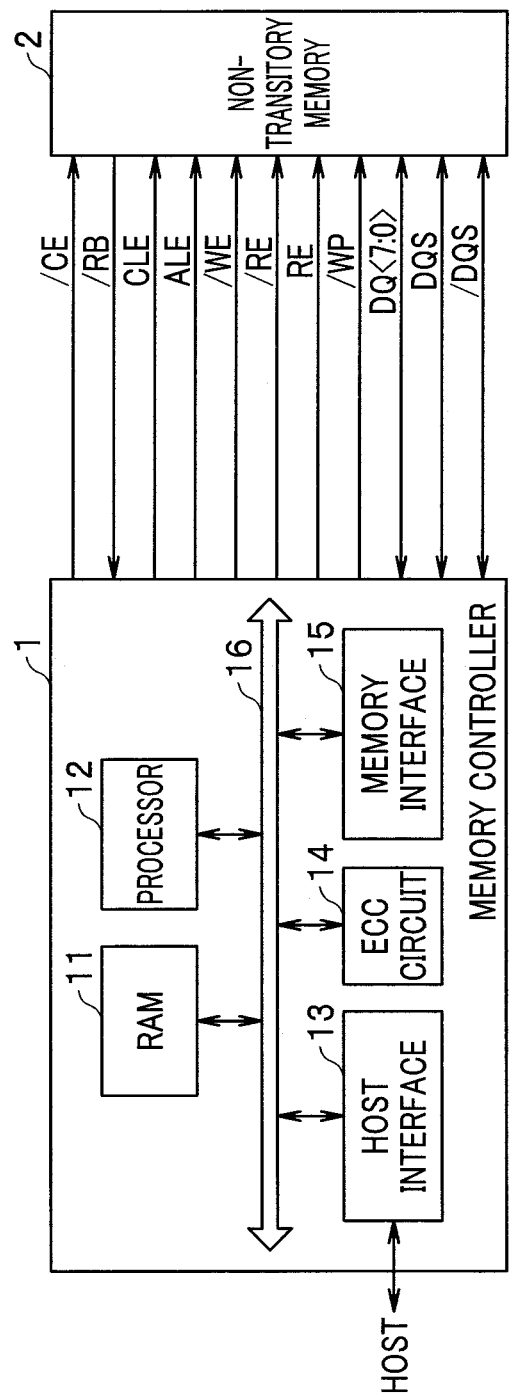
FIG. 1 is a block diagram illustrating an example of a configuration of a storage device according to an embodiment.

FIG. 1 is a block diagram illustrating an example of a configuration of a memory system according to the embodiment. The memory system of the embodiment includes a memory controller 1 and a non-transitory memory 2 that is a semiconductor storage device. The memory system is connectable with a host. The host is an electronic device such as a personal computer or a portable terminal.

The non-transitory memory 2 is a memory configured to non-transitorily store data and includes, for example, a NAND memory (NAND flash memory). The non-transitory memory 2 is, for example, a NAND memory including a memory cell capable of storing three bits per memory cell, in other words, is a 3 bit/Cell (triple level cell (TLC)) NAND memory. Note that the non-transitory memory 2 may be a 1 bit/Cell, 2 bit/Cell, or 4 bit/Cell NAND memory.

The memory controller 1 controls data writing to the non-transitory memory 2 in accordance with a writing request from the host. The memory controller 1 also controls data reading from the non-transitory memory 2 in accordance with a reading request from the host. A chip enable signal /CE, a ready busy signal /RB, a command latch enable signal CLE, an address latch enable signal ALE, a write enable signal /WE, read enable signals RE and /RE, a write protect signal /WP, signals DQ <7:0> as data, and data strobe signals DQS and /DQS are transmitted and received between the memory controller 1 and the non-transitory memory 2.

For example, the non-transitory memory 2 and the memory controller 1 are each formed as a semiconductor chip (hereinafter also simply referred to as "chip").

The chip enable signal /CE is a signal for enabling the non-transitory memory 2. The ready busy signal /RB is a signal for indicating whether the non-transitory memory 2 is in a ready state (state in which a command from outside is to be received) or a busy state (state in which a command from the outside is not to be received). The command latch enable signal CLE is a signal indicating that signals DQ <7:0> are commands. The address latch enable signal ALE is a signal indicating that signals DQ <7:0> are addresses. The write enable signal /WE is a signal for taking a received signal into the non-transitory memory 2 and is asserted each time a command, an address or data is received by the memory controller 1. The non-transitory memory 2 is instructed to take in signals DQ <7:0> while the signal /WE is at "Low (L)" level.

The read enable signals RE and /RE are signals for the memory controller 1 to read data from the non-transitory memory 2. For example, the read enable signals RE and /RE are used to control an operation timing of the non-transitory memory 2 when the signals DQ <7:0> are output. The write protect signal /WP is a signal for instructing the non-transitory memory 2 to inhibit data writing and erasure. The signals DQ <7:0> are main bodies of data transmitted and received between the non-transitory memory 2 and the memory controller 1 and include commands, addresses and data. The data strobe signals DQS and /DQS are signals for controlling input-output timings of the signals DQ <7:0>.

The memory controller 1 includes a random access memory (RAM) 11, a processor 12, a host interface 13, an error check and correct (ECC) circuit 14, and a memory interface 15. The RAM 11, the processor 12, the host interface 13, the ECC circuit 14, and the memory interface 15 are connected with each other through an internal bus 16.

The host interface 13 outputs, to the internal bus 16, a request, user data (writing data), and the like received from the host. The host interface 13 also transmits, to the host, user data read from the non-transitory memory 2, a response from the processor 12, and the like.

The memory interface 15 controls, based on an instruction from the processor 12, processing of writing user data and the like to the non-transitory memory 2 and processing of reading user data and the like from the non-transitory memory 2.

The processor 12 collectively controls the memory controller 1. The processor 12 is, for example, a central processing unit (CPU) or a micro processing unit (MPU) When having received a request from the host through the host interface 13, the processor 12 performs control in accordance with the request. For example, in accordance with a request from the host, the processor 12 instructs the memory interface 15 to write user data and parity to the non-transitory memory 2. In addition, in accordance with a request from the host, the processor 12 instructs the memory interface 15 to read user data and parity from the non-transitory memory 2.

The processor 12 determines a storage region (memory region) in the non-transitory memory 2 for user data accumulated in the RAM 11. The user data is stored in the RAM 11 through the internal bus 16. The processor 12 performs the memory region determination for data (page data) per page as the unit of writing. In the present specification, unit data is defined to be user data stored in a page of the non-transitory memory 2. The unit data is typically encoded by the ECC circuit 14 and stored in the non-transitory memory 2 as a code word. In the present embodiment, encoding is not essential. The memory controller 1 may store the unit data in the non-transitory memory 2 without encoding, but FIG. 1 illustrates an example of a configuration in which encoding is performed. When the memory controller 1 does not perform encoding, the page data is same as the unit data. One code word may be generated based on one unit data or based on divided data into which the unit data is divided. Alternatively, one code word may be generated by using a plurality of pieces of unit data.

The processor 12 determines, for each unit data, a memory region in the non-transitory memory 2 at a writing destination. A physical address is allocated to each memory region in the non-transitory memory 2. The processor 12 manages a memory region as the writing destination of each unit data by using the physical address. The processor 12 specifies the determined memory region (physical address) and instructs the memory interface 15 to write user data to the non-transitory memory 2. The processor 12 manages correspondence between a logical address (logical address managed by the host) of the user data and the physical address. When having received a reading request including a logical address from the host, the processor 12 specifies a physical address corresponding to the logical address and instructs the memory interface 15 to read user data with specification of the physical address.

The ECC circuit 14 generates a code word by encoding user data stored in the RAM 11. In addition, the ECC circuit 14 decodes a code word read from the non-transitory memory 2.

The RAM 11 temporarily stores user data received from the host until storage in the non-transitory memory 2, or temporarily stores data read from the non-transitory memory 2 until transmission to the host. The RAM 11 is a general-purpose memory such as a static random access memory (SRAM) or a dynamic random access memory (DRAM).

FIG. 1 illustrates an example of a configuration in which the memory controller 1 includes the ECC circuit 14 and the memory interface 15. However, the ECC circuit 14 may be built in the memory interface 15. Alternatively, the ECC circuit 14 may be built in the non-transitory memory 2.

When having received a writing request from the host, the memory system operates as follows. The processor 12 temporary stores writing target data in the RAM 11. The processor 12 reads the data stored in the RAM 11 and inputs the read data to the ECC circuit 14. The ECC circuit 14 encodes the input data and inputs the code word to the memory interface 15. The memory interface 15 writes the input code word to the non-transitory memory 2.

When having received a reading request from the host, the memory system operates as follows. The memory interface 15 inputs, to the ECC circuit 14, a code word read from the non-transitory memory 2. The ECC circuit 14 decodes the input code word and stores the decoded data in the RAM 11. The processor 12 transmits the data stored in the RAM 11 to the host through the host interface 13.

1-2. Configuration of Non-Transitory Memory

Figure 2:
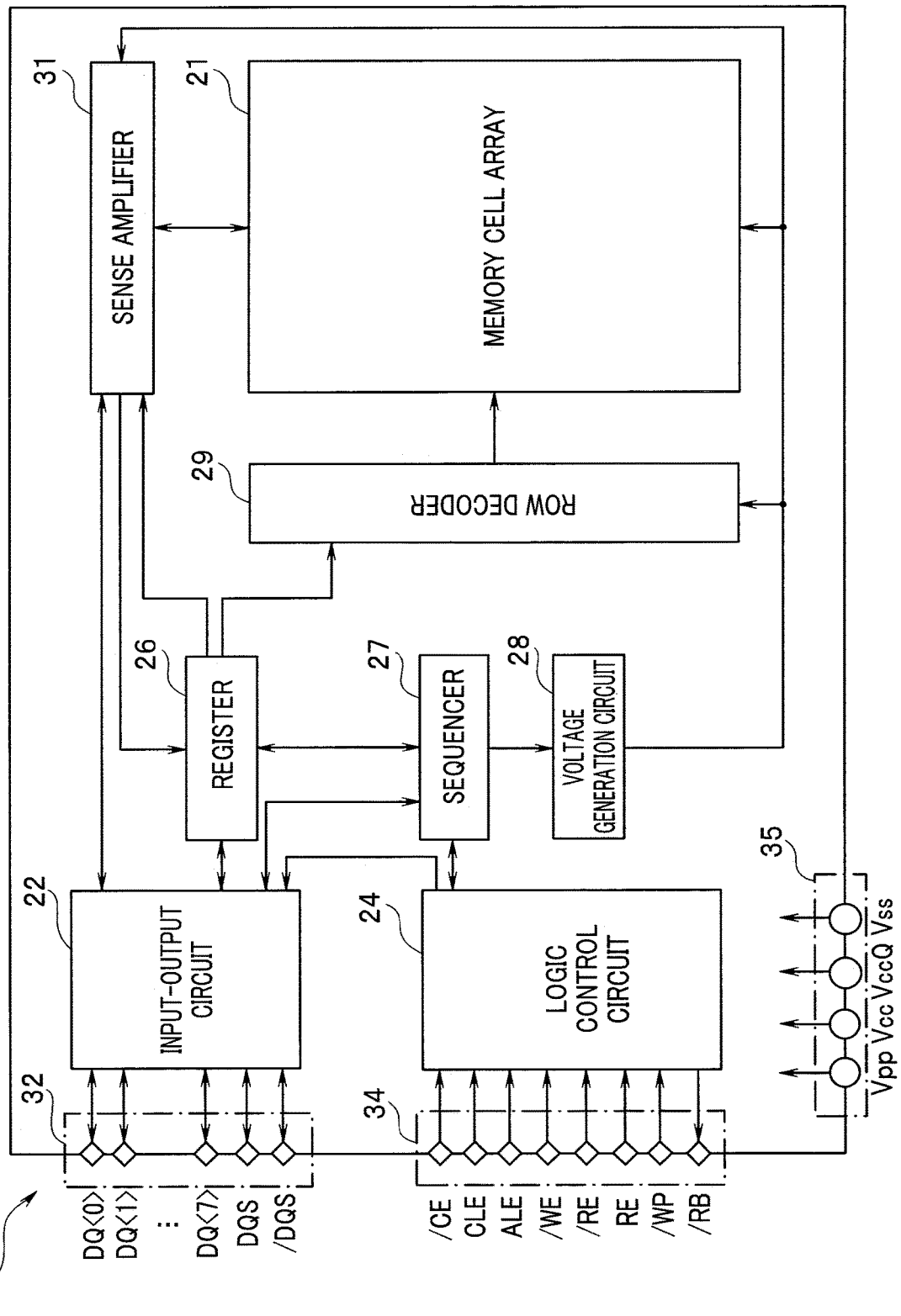
FIG. 2 is a block diagram illustrating an example of a configuration of a non-transitory memory of the embodiment.

FIG. 2 is a block diagram illustrating an example of a configuration of the non-transitory memory of the embodiment. The non-transitory memory 2 includes a memory cell array 21, an input-output circuit 22, a logic control circuit 24, a register 26, a sequencer 27, a voltage generation circuit 28, a row decoder 29, a sense amplifier 31, an input-output pad group 32, a logic control pad group 34, and a power source inputting terminal group 35.

The memory cell array 21 includes a plurality of non-transitory memory cells (not illustrated) each associated with a word line and a bit line.

The input-output circuit 22 transmits and receives the signals DQ <7:0> and the data strobe signals DQS and /DQS to and from the memory controller 1. The input-output circuit 22 forwards commands and addresses in the signals DQ <7:0> to the register 26. The input-output circuit 22 transmits and receives writing data and reading data to and from the sense amplifier 31.

The logic control circuit 24 receives the chip enable signal /CE, the command latch enable signal CLE, the address latch enable signal ALE, the write enable signal /WE, the read enable signals RE and /RE, and the write protect signal /WP from the memory controller 1. The logic control circuit 24 gives notification of a state of the non-transitory memory 2 to the outside by forwarding the ready busy signal /RB to the memory controller 1.

The voltage generation circuit 28 generates, based on an instruction from the sequencer 27, voltage necessary for operation such as data writing, reading, and erasure.

The row decoder 29 receives a block address and a row address in an address from the register 26, selects a corresponding block based on the block address, and selects a corresponding word line based on the row address.

At data reading, the sense amplifier 31 senses reading data that is read from a memory cell to a bit line and forwards the sensed reading data to the input-output circuit 22. At data writing, the sense amplifier 31 forwards, to a memory cell, writing data that is written through a bit line.

The input-output pad group 32 includes a plurality of terminals (pads) corresponding to the signals DQ <7:0> and the data strobe signals DQS and /DQS to transmit and receive signals including data to and from the memory controller 1.

The logic control pad group 34 includes a plurality of terminals (pads) corresponding to the chip enable signal /CE, the command latch enable signal CLE, the address latch enable signal ALE, the write enable signal /WE, the read enable signals RE and /RE, and the write protect signal /WP to transmit and receive signals to and from the memory controller 1.

The power source inputting terminal group 35 includes a plurality of terminals through which power voltages Vcc, VccQ, and Vpp and ground voltage Vss are input to supply various kinds of operation power sources to the non-transitory memory 2 from the outside. The power voltage Vcc is circuit power voltage provided as an operation power source typically from the outside, and is input as voltage of, for example, 3.3 V approximately. The power voltage VccQ is input as voltage of for example, 1.2 V. The power voltage VccQ is used to transmit and receive signals between the memory controller 1 and the non-transitory memory 2. To cope with increase of operation speed, a plurality of power source pads dedicated to input-output terminals are disposed near the input-output pad group 32 as terminals through which the power voltage VccQ as first voltage and the ground voltage Vss as second voltage are input.

The power voltage Vpp is power voltage higher than the power voltage Vcc and input as voltage of, for example, 12 V. High voltage of 20 V approximately is needed to write data to the memory cell array 21 or erase data. In this case, desired voltage can be generated faster with smaller electric power consumption by stepping up the power voltage Vpp of 12 V approximately than by stepping up the power voltage Vcc of 3.3 V approximately at a step-up circuit of the voltage generation circuit 28. However, no voltage needs to be supplied for the power voltage Vpp, for example, when the non-transitory memory 2 is used in an environment in which high voltage cannot be supplied. Even when the power voltage Vpp is not supplied, the non-transitory memory 2 can execute various operations as long as the power voltage Vcc is supplied. In other words, the power voltage Vcc is a power source normally supplied to the non-transitory memory 2, and the power voltage Vpp is a power source additionally and optionally supplied in accordance with, for example, use environment.

1-3. Sectional Structure of Non-Transitory Memory

Figure 3:
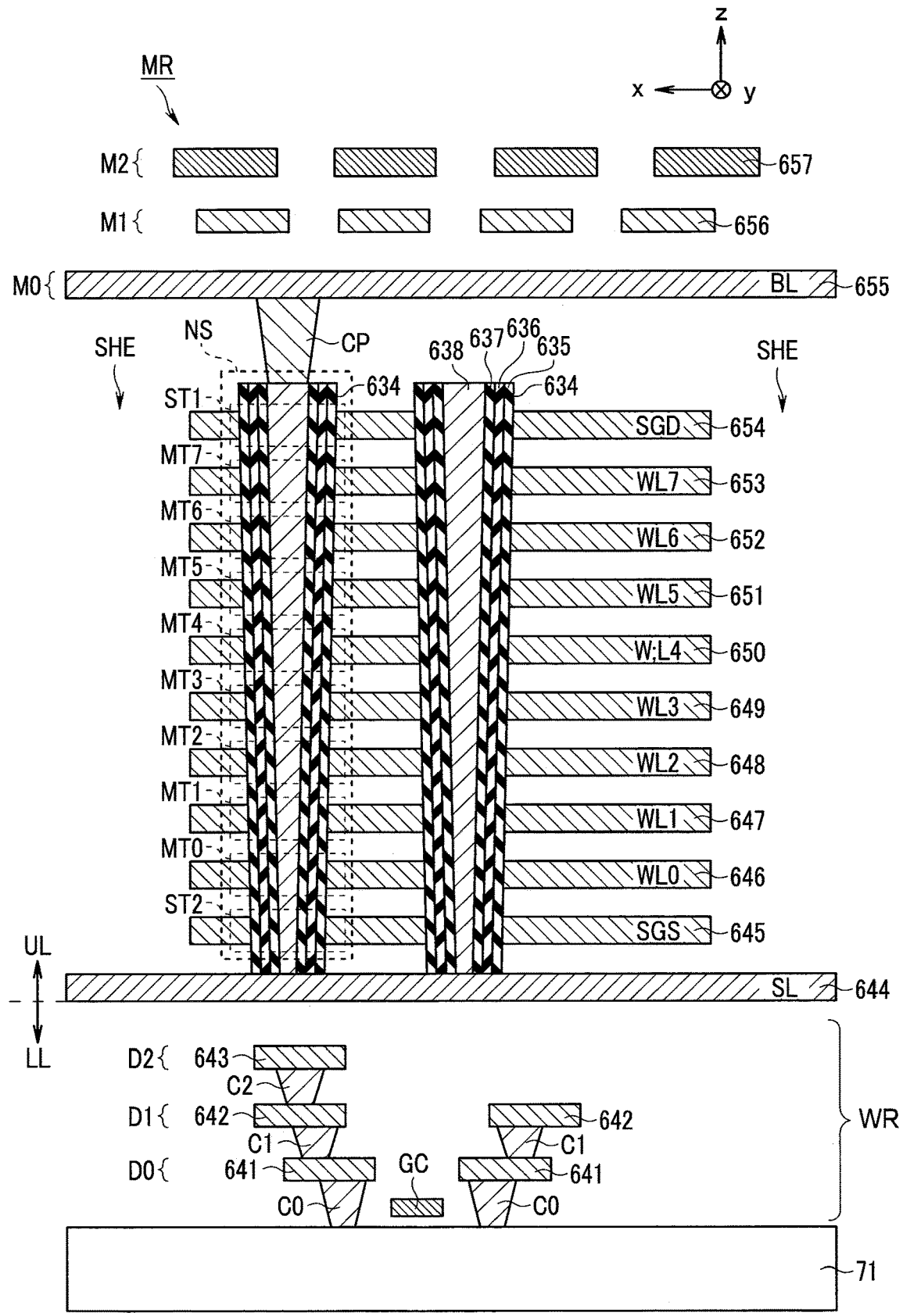
FIG. 3 is a cross-sectional view of a partial region of a semiconductor storage device according to the embodiment.

FIG. 3 is a cross-sectional view of a partial region of the semiconductor storage device according to the embodiment. FIG. 3 illustrates the semiconductor storage device having a structure in which a peripheral circuit region is formed on a semiconductor substrate 71 and a memory region is formed in an upper layer of the peripheral circuit region. Note that, in the following description, an x direction and a y direction are defined to be two directions horizontal to the surface of the semiconductor substrate 71 and orthogonal to each other, and a z direction is defined to be a direction vertical to the surface of the semiconductor substrate 71.

As illustrated in FIG. 3, the non-transitory memory includes the semiconductor substrate 71, conductive bodies 641 to 657, a memory hole 634, and contact plugs C0, C1, C2, and CP in a memory region MR. Note that illustrations of p-type and n-type well regions formed at parts of an upper surface of the semiconductor substrate 71, an impurity diffusion region formed in each well region, and an element separation region that provides insulation between well regions are omitted in drawings described below.

In the memory region MR, for example, a plurality of contacts C0 are provided on the semiconductor substrate 71. The plurality of contacts C0 are connected with respective impurity diffusion regions (not illustrated) provided in the semiconductor substrate 71. The memory cell array of the NAND memory is disposed on the semiconductor substrate 71 through a wiring layer region WR. Note that a peripheral circuit such as the input-output circuit is formed in the wiring layer region WR.

The conductive body 641 that forms a wiring pattern is provided on each contact C0. Part of the plurality of wiring patterns of the conductive bodies 641 is part of bit lines BL described above. Other part of the plurality of wiring patterns is part of wires of various transistors. In this case, a gate electrode GC is provided near each region between conductive bodies 641 adjacent to each other, one of the adjacent conductive bodies 641 is connected with a drain of a transistor, and the other conductive body 641 is connected with a source of the transistor.

For example, the contact C1 is provided on each conductive body 641. For example, the conductive body 642 is provided on each contact C1. For example, the contact C2 is provided on the conductive body 642. For example, the conductive body 643 is provided on the contact C2.

Wiring patterns of the conductive bodies 641, 642, and 643 are disposed in the wiring layer region WR between a sense amplifier circuit (not illustrated) and the memory cell array. Hereinafter, wiring layers in which the conductive bodies 641, 642, and 643 are provided are referred to as wiring layers D0, D1, and D2, respectively. The wiring layers D0, D1, and D2 are provided in a lower layer part of the non-transitory memory 2. Note that although the three wiring layers are provided in the wiring layer region WR in this example, two or less wiring layers or four or more wiring layers may be provided in the wiring layer region WR.

The conductive body 644 is provided above the conductive body 643 through, for example, an interlayer insulating film. The conductive body 644 is, for example, a source line SL formed in a plate shape parallel to an xy plane. For example, the conductive bodies 645 to 654 are sequentially stacked above the conductive body 644 in a manner corresponding to respective NAND strings NS. An interlayer insulating film (not illustrated) is provided between conductive bodies adjacent to each other in the z direction among these conductive bodies.

A structural body (the plurality of NAND strings NS) corresponding to one string unit SU is provided between slits SHE adjacent to each other. Each slit SHE extends, for example, in the y direction and the z direction and insulates the conductive bodies 645 to 654 provided to a string unit SU from the conductive bodies 645 to 654 provided to an adjacent string unit SU (not illustrated).

The conductive bodies 645 to 654 are each formed, for example, in a plate shape parallel to the xy plane. For example, the conductive body 645 corresponds to a select gate line SGS, the conductive bodies 646 to 653 correspond to word lines WL0 to WL7, respectively, and the conductive body 654 corresponds to a select gate line SGD.

Each memory hole 634 is provided in a column shape penetrating through the conductive bodies 645 to 654 and contacts the conductive body 644. For example, a block insulating film 635, an electric charge accumulation film 636, and a gate insulating film 637 are sequentially formed in the memory hole 634, and in addition, a conductive body column 638 is embedded in the memory hole 634.

For example, a part at which the memory hole 634 intersects the conductive body 645 functions as a selection transistor ST2. A part at which the memory hole 634 intersects each of the conductive bodies 645 to 654 functions as a memory cell transistor (memory cell) MT. A part at which the memory hole 634 intersects the conductive body 654 functions as a selection transistor ST1.

The conductive body 655 is provided at an upper layer of an upper surface of the memory hole 634 through an interlayer insulating film. The conductive body 655 is formed in a line shape extending in the x direction and corresponds to a bit line BL. The plurality of conductive bodies 655 are arrayed at intervals in the y direction (not illustrated). Each conductive body 655 is electrically connected with the conductive body column 638 in one memory hole 634 of the corresponding string unit SU.

Specifically, in each string unit SU, a contact plug CP is provided, for example, on the conductive body column 638 in the memory hole 634, and one conductive body 645 is provided on the contact plug CP. Note that the present invention is not limited to such a configuration, but the conductive body column 638 in the memory hole 634 may be connected with the conductive body 655 through, for example, a plurality of contacts or wires.

The conductive body 656 is provided at an upper layer of the layer at which the conductive body 655 is provided, through an interlayer insulating film. The conductive body 657 is provided at an upper layer of the layer at which the conductive body 656 is provided, through an interlayer insulating film.

The conductive bodies 656 and 657 correspond to, for example, a wire for connecting a wire provided to the memory cell array and a peripheral circuit provided under the memory cell array. The conductive bodies 656 and 657 may be connected with each other through a column-shaped contact (not illustrated). In the following, the layer at which the conductive body 655 is provided is referred to as a wiring layer M0, the layer at which the conductive body 656 is provided is referred to as a wiring layer M1, and the layer at which the conductive body 657 is provided is referred to as a wiring layer M2.

As illustrated in FIG. 3, the wiring layers D0, D1, and D2 are formed at lower layers of the string unit SU in the semiconductor storage device of the embodiment. In addition, the wiring layers M0, M1, and M2 are formed at upper layers of the string unit SU. The wiring layers D0, D1, and D2 are tungsten wires formed by, for example, a damascene method.

The wiring layer M2 may be an aluminum wire formed by anisotropic etching such as reactive ion etching (RIE). The wiring layer M2 has a large film thickness and it is difficult to form a minute wiring pattern at the wiring layer M2, and thus trunk power wires (Vcc and Vss) are allocated to the wiring layer M2. The wiring layer M1 is, for example, a copper (Cu) wire formed by the damascene method. A Cu wire has a low resistance and has high wiring reliability such as EM (electro migration) tolerance, and thus a signal line through which fast transfer needs to be performed is allocated to the wiring layer M1. The wiring layer M0 is, for example, a Cu wire formed by the damascene method. The wiring layer M0 is used as the bit line BL, and part of the trunk power wires is allocated to the wiring layer M0 to achieve power source enhancement.

Formation of a metal wire by the damascene method is performed, for example, through a procedure described below. First, an insulating film such as a silicon oxide film is deposited on the entire surface of a silicon substrate. Subsequently, a groove is formed in the insulating film by anisotropic etching. The groove is formed along a wiring pattern of the metal wire. Subsequently, a metallic material of the wire is embedded in the groove by electric field plating or the like. Lastly, the metallic material out of the groove is removed by chemical mechanical polishing (CMP) or the like, which ends formation of a wiring layer.

A polishing speed of the CMP is different among materials. Specifically, the polishing speed for copper as a wiring member material is different from the polishing speed for a silicon oxide film in which a wire is embedded. Thus, difference occurs between removed amounts at places where wiring density is high and low, and a step is caused due to non-uniformity, which degrades flatness. Thus, a method of adding a dummy pattern to a wiring space (region in which no wire is formed) of a certain area or larger to increase in-plane uniformity of the wiring density is used to improve flatness. A material same as a material embedded in the wiring pattern is embedded in the dummy pattern. For example, when a Cu wire is formed in a wiring layer, copper (Cu) is embedded in the wiring pattern and the dummy pattern.

2. Arrangement 2-1. Arrangement of Dummy Pattern

Figure 4A:
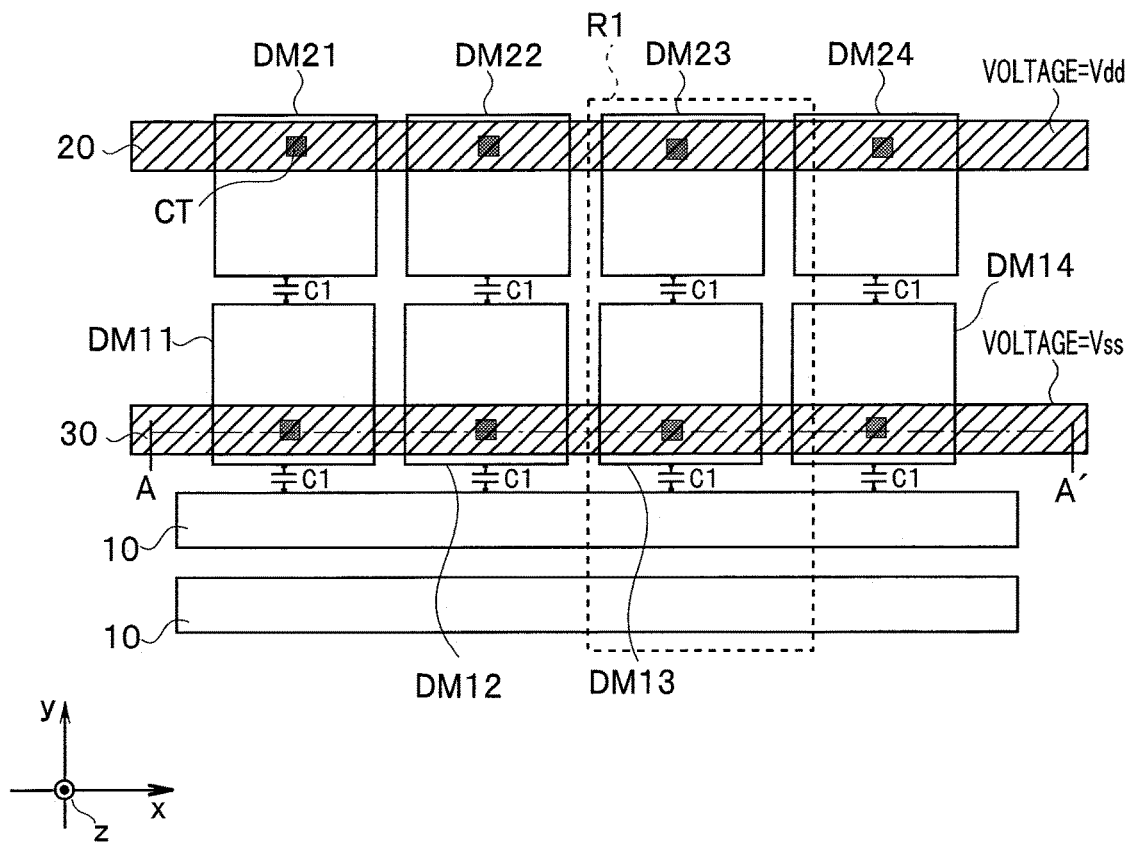
FIG. 4A is a schematic arrangement diagram of dummy patterns and wires according to a comparative example.
Figure 4B:
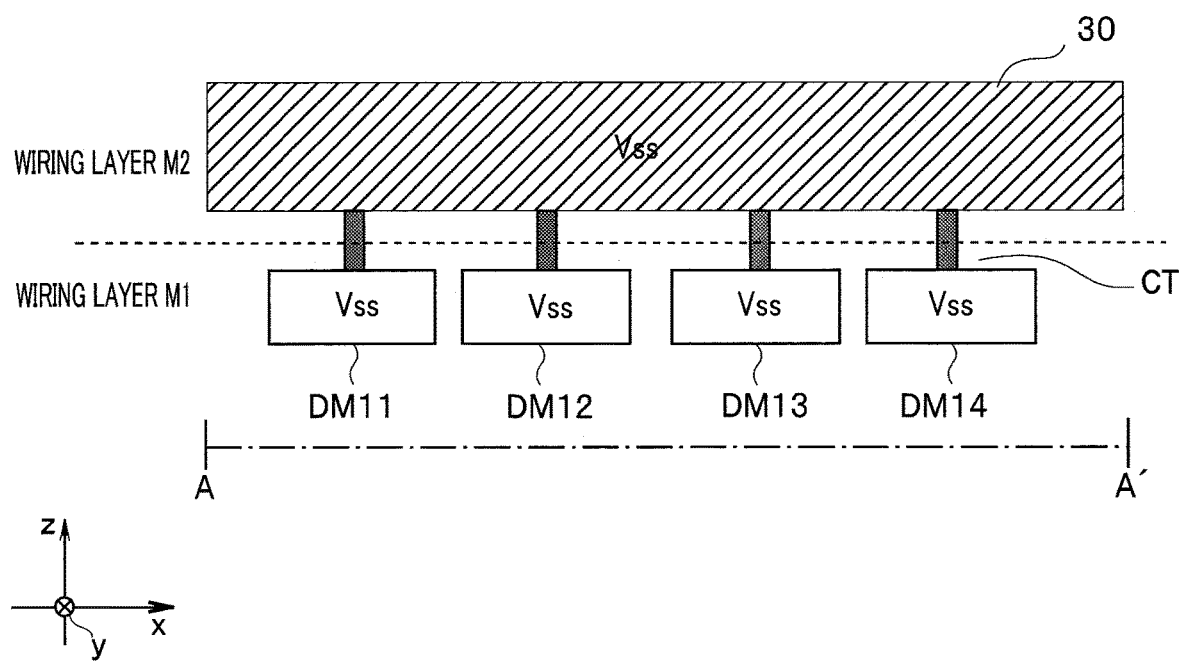
FIG. 4B is a cross-sectional view taken along line A-A' in FIG. 4A.

Dummy pattern arrangement of a comparative example will be first described below with reference to FIGS. 4A and 4B before description of dummy pattern arrangement of the present embodiment. FIG. 4A is a schematic arrangement diagram of dummy patterns and wires according to the comparative example. Specifically, FIG. 4A is a schematic arrangement diagram of the wiring layers M1 and M2 on the xy plane when viewed in the z direction. FIG. 4B is a cross-sectional view taken along line A-A' in FIG. 4A.

Note that, as for a formation region of a dummy pattern DM disposed in the wiring layer M1 in the following description, a positive side in the x direction is also referred to as "one side in the x direction", a negative side in the x direction is also referred to as "the other side in the x direction", a positive side in the y direction is also referred to as "one side in the y direction", a negative side in the y direction is also referred to as "the other side in the y direction", a positive side in the z direction is also referred to as "one side in the z direction" or an "upper side", and a negative side in the z direction is also referred to as "the other side in the z direction" or a "lower side".

A plurality of signal lines 10 extending in the x direction are disposed in the wiring layer M1. Each signal line 10 is a wire used for data transmission and reception and is, for example, used to connect the logic control circuit 24 and the sequencer 27. A plurality of dummy patterns DM11 to DM24 having square shapes are disposed in a region in which no wire is laid on the upper side of the signal lines 10 in the y direction. The dummy patterns DM11 to DM14 are disposed at a predetermined interval in the x direction on the one side of the signal lines 10 in the y direction. The dummy patterns DM21 to DM24 are disposed at a predetermined interval in the x direction on the one side of the dummy patterns DM11 to DM14 in the y direction. In other words, the dummy patterns DM11 to DM24 are disposed in a matrix of two rows and four columns. Hereinafter, in a dummy pattern DMij, "i" indicates a row to which the dummy pattern DM belongs, and "j" indicates a column to which the dummy pattern DM belongs. Note that FIG. 4A exemplarily illustrates a case in which the number of dummy patterns DM per row is four, but the present invention is not limited to the case. The number may be five or larger or may be three or smaller in accordance with a void space of the wiring layer M1, a length of each signal line 10 in the x direction, a wiring density rule, and the like. FIG. 4A exemplarily illustrates a case in which the number of dummy patterns DM in a direction (the y direction) orthogonal to a direction (the x direction) in which each signal line 10 extends, in other words, per column is two, but the present invention is not limited to the case. The number may be three or larger in accordance with the void space of the wiring layer M1, the wiring density rule, and the like.

A Vdd voltage supply line 20 extending in the x direction and a Vss voltage supply line 30 extending in the x direction are disposed in the wiring layer M2. The Vdd voltage supply line 20 is disposed on the upper side of the dummy patterns DM21 to DM24 on the second row in the z direction. The Vss voltage supply line 30 is disposed on the upper side of the dummy patterns DM11 to DM14 on the first row in the z direction. Note that voltage Vdd is voltage obtained by stepping down, through a step-down circuit (not illustrated), the power voltage Vcc supplied from the outside. For example, at data writing to a memory cell MT, the voltage Vdd is supplied to a bit line BL connected with a non-data writing target NAND string NS in a selected string unit SU.

As capacitance between the Vdd voltage supply line 20 and the Vss voltage supply line 30 is larger, voltage variation of the Vdd voltage supply line 20 and the Vss voltage supply line 30 is reduced and noise tolerance improves, which leads to stabilized operation. Thus, as illustrated in FIG. 4B, each of the dummy patterns DM11 to DM14 is electrically connected with the Vss voltage supply line 30 through a contact plug CT, and the voltage Vss is applied to the dummy patterns DM11 to DM14. Similarly, each of the dummy patterns DM21 to DM24 is electrically connected with the Vdd voltage supply line 20 through a contact plug CT, and the voltage Vdd is applied to the dummy patterns DM21 to DM24. Accordingly, capacitance is generated between each of the dummy patterns DM11 to DM14 on the first row and the corresponding one of the dummy patterns DM21 to DM24 on the second row, thereby increasing the capacitance between the Vdd voltage supply line 20 and the Vss voltage supply line 30.

For example, capacitance C1 is generated between the dummy patterns DM13 and DM23 in a region R1 surrounded by a dotted line in FIG. 4A. Similarly, the capacitance C1 is generated between the dummy patterns DM11 and DM21, between the dummy patterns DM12 and DM22, and between the dummy patterns DM14 and DM24. Thus, inter-power-source capacitance is increased by 4×C1 as a whole.

However, when the voltage Vss is applied to the dummy patterns DM11 to DM14 on the first row, capacitance is adversely generated between a signal line 10 and each of the dummy patterns DM11 to DM14. As illustrated in the cross-sectional view in FIG. 4B, the dummy patterns DM11 to DM14 have an area of "Length corresponding to one side of the square in the x direction"ד"Length of a wire to be formed in the z direction" on an xz surface. Area of the dummy patterns DM11 to DM14 in the cross-sectional view of FIG. 4B is equal to area of end faces of the dummy patterns DM11 to DM14 on the other side in the y direction. Accordingly, when the voltage Vss is applied to the dummy patterns DM11 to DM14, parasitic capacitance is generated in accordance with the area of the end faces of the dummy patterns DM11 to DM14 on the other side in the y direction and a distance from the end faces of the dummy patterns DM11 to DM14 on the other side in the y direction to an end face of the signal line 10 on the one side in the y direction.

For example, the capacitance C1 is generated between the dummy pattern DM13 and the signal line 10 in the region R1 surrounded by a dotted line in FIG. 4A. Similarly, the capacitance C1 is generated between the dummy pattern DM11 and the signal line 10, between the dummy pattern DM12 and the signal line 10, and between the dummy pattern DM14 and the signal line 10. Thus, the parasitic capacitance is increased by 4×C1 as a whole. The increase of the parasitic capacitance causes delay to a signal transferred through the signal line 10.

Figure 5A:
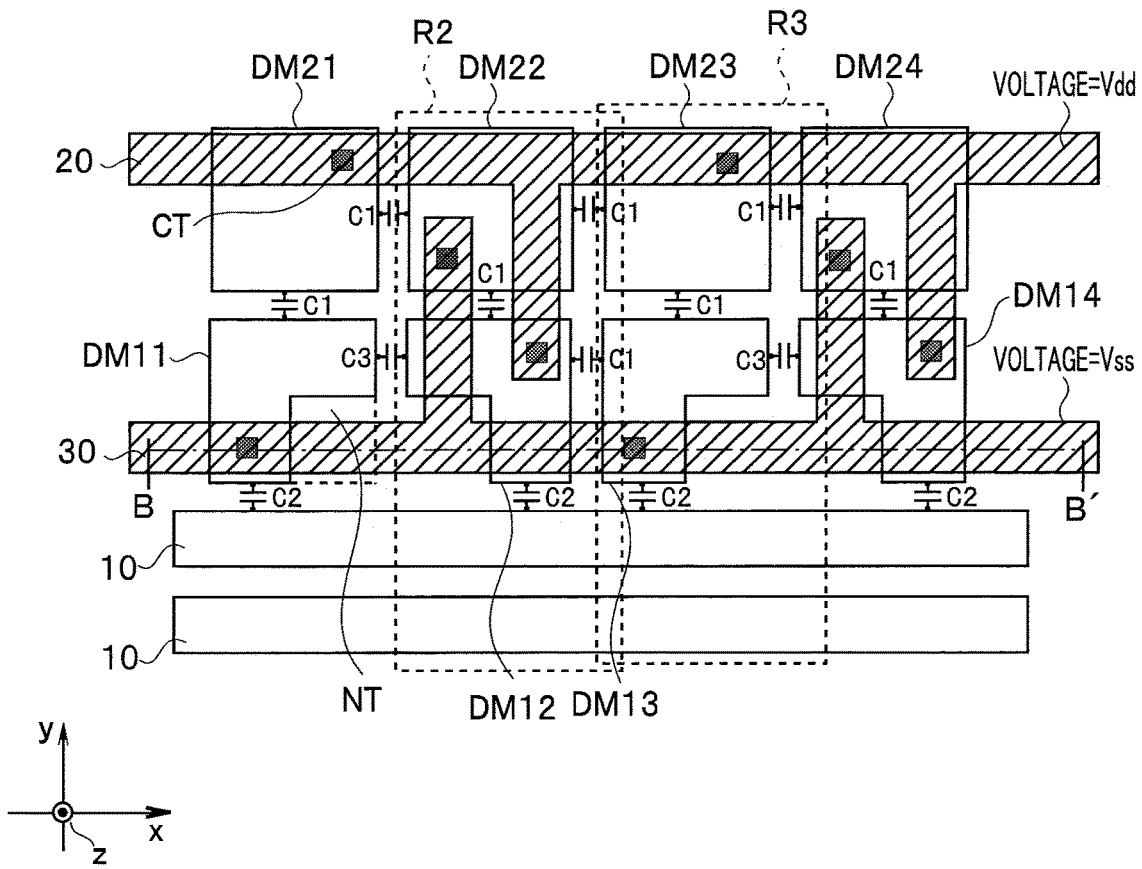
FIG. 5A is a schematic arrangement diagram of dummy patterns and wires according to a first embodiment.
Figure 5B:
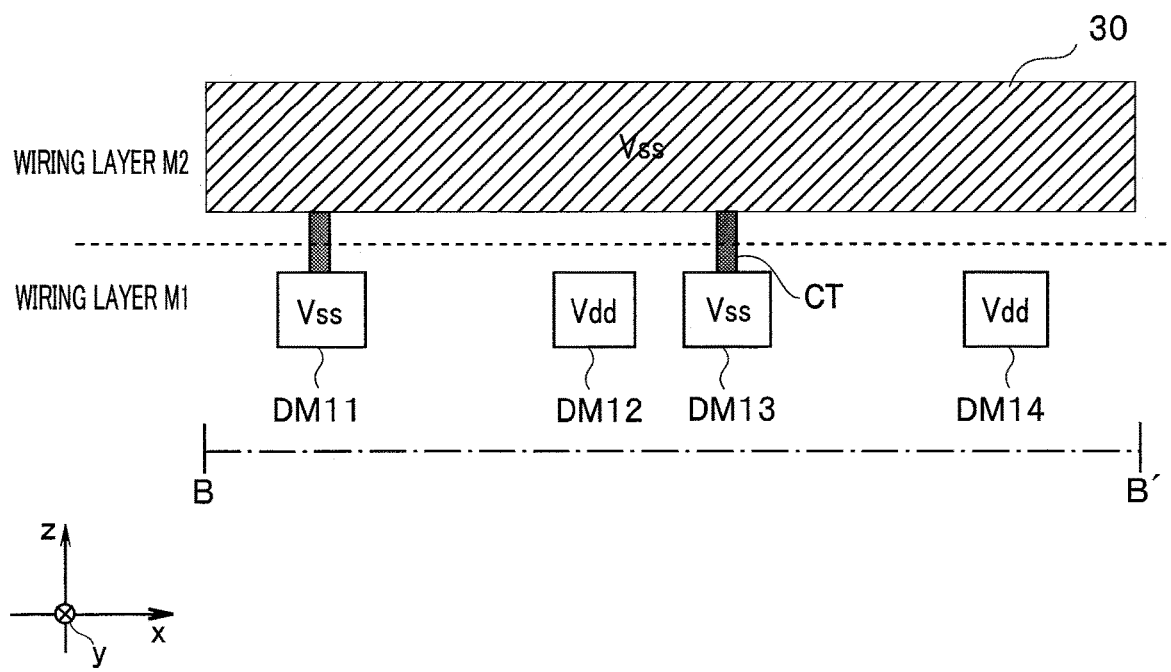
FIG. 5B is a cross-sectional view taken along line B-B' in FIG. 5A.

Subsequently, the dummy pattern arrangement according to the present embodiment will be described below with reference to FIGS. 5A and 5B. FIG. 5A is a schematic arrangement diagram of dummy patterns and wires according to a first embodiment. Specifically, FIG. 5A is a schematic arrangement diagram of the wiring layers M1 and M2 on the xy plane when viewed in the z direction. FIG. 5B is a cross-sectional view taken along line B-B' in FIG. 5A.

As illustrated in FIG. 5A, arrangement of the signal lines 10 is same as the arrangement of the comparative example illustrated in FIG. 4. In addition, disposition places of the Vdd voltage supply line 20 and the Vss voltage supply line 30 are same as disposition places of the comparative example illustrated in FIG. 4A. Moreover, the number and disposition places of the dummy patterns DM11 to DM24 are same as in the comparative example. The present embodiment is different from the comparative example in the shapes of the dummy patterns DM11 to DM14 disposed adjacent to a signal line 10. Specifically, the dummy patterns DM11 to DM14 of the present embodiment illustrated in FIG. 5A each have a polygonal shape in which a cutout portion NT is provided to a side facing the signal line 10 in a square (hereinafter referred to as a reference square) same as the square of each of the dummy patterns DM21 to DM24 not adjacent to the signal line 10. Accordingly, when the cutout portion NT is provided, part of a side facing the signal line 10 in each of the dummy patterns DM11 to DM14 is displaced toward the one side in the y direction, and thus a distance between the dummy patterns DM11 to DM14 and the signal line 10 increases as compared to the comparative example. As a result, parasitic capacitance C2 between each of the dummy patterns DM11 to DM14 and the signal line 10 becomes smaller than the parasitic capacitance C1 in the comparative example.

For example, when the dummy patterns DM11 to DM14 each has a polygonal shape in which the cutout portion NT of a square having a length corresponding to ½ of each side of the square of the dummy pattern is provided at one corner of the square as illustrated in FIG. 5A, the dummy patterns DM11 to DM14 have an area of "Length corresponding to ½ of each side of the reference square in the x direction"× "Length of a wire to be formed (signal line 10) in the z direction" on the xz surface as illustrated in the cross-sectional view in FIG. 5B. Thus, the area of each of the end faces of the dummy patterns DM11 to DM14 on the other side in the y direction in the cross-sectional view of FIG. 5B is half of the area of the corresponding one of the dummy patterns DM11 to DM14 in the comparative example in FIG. 4B. With this configuration, the parasitic capacitance of the embodiment is half of the parasitic capacitance C1 of the comparative example. In addition, parasitic capacitance is generated between an end face of the cutout portion NT in each of the dummy patterns DM11 to DM14 on the other side in the y direction and the end face of the signal line 10 on the one side in the y direction. However, since a distance between the end faces is increased by a length of each side of the cutout portion NT, the parasitic capacitance is smaller than half of the parasitic capacitance of the comparative example (for example, ¼ approximately of the parasitic capacitance C1 of the comparative example). Thus, the parasitic capacitance C2 between the dummy pattern DM11 and the signal line 10 of the embodiment is ¾ approximately of the parasitic capacitance C1 of the comparative example.

The present embodiment is different from the comparative example also in the shapes of the Vdd voltage supply line 20 and the Vss voltage supply line 30. Specifically, the Vdd voltage supply line 20 and the Vss voltage supply line 30 each have a shape in which a plurality of branch wires branched in the y direction are provided halfway through a trunk wire extending in the x direction. Each branch wire extends to above dummy patterns DM of a row adjacent to a row of dummy patterns DM positioned below the trunk wire. The branch wire is provided at every other dummy pattern DM. A direction in which the branch wires branched from the trunk wire of the Vdd voltage supply line 20 extend is opposite to a direction in which the branch wires branched from the trunk wire of the Vss voltage supply line 30 extend. Specifically, the branch wires branched from the trunk wire of the Vdd voltage supply line 20 extend in a direction toward the Vss voltage supply line 30 (the other side in the y direction), and the branch wires branched from the trunk wire of the Vss voltage supply line 30 extend in a direction toward the Vdd voltage supply line 20 (the one side in the y direction). The branch wires of the Vdd voltage supply line 20 and the branch wires of the Vss voltage supply line 30 are provided above dummy patterns DM on even-numbered columns (or odd-numbered columns).

For example, in FIG. 5A, the dummy patterns DM11 to DM14 on the first row are disposed below the Vss voltage supply line 30. Branch wires branch from the trunk wire of the Vss voltage supply line 30 above the dummy pattern DM12 and the dummy pattern DM14. The branch wire branched from the trunk wire above the dummy pattern DM12 extends to above the dummy pattern DM22. The branch wire branched from the trunk wire above the dummy pattern DM14 extends to above the dummy pattern DM24. The dummy patterns DM21 to DM24 on the second row are disposed below the Vdd voltage supply line 20. Branch wires branch from the trunk wire of the Vdd voltage supply line 20 above the dummy pattern DM22 and the dummy pattern DM24. The branch wire branched from the trunk wire above the dummy pattern DM22 extends to above the dummy pattern DM12. The branch wire branched from the trunk wire above the dummy pattern DM24 extends to above the dummy pattern DM14.

A leading end of each branch wire and a dummy pattern DM positioned below the leading end are electrically connected with each other through the contact plug CT. The trunk wire of the Vdd voltage supply line 20 and the trunk wire of the Vss voltage supply line 30 are each provided with the contact plug CT between branch points of branch wires adjacent to each other and are each electrically connected with each dummy pattern DM positioned below the trunk wire. In other words, each dummy pattern DM electrically connected with no branch wire is electrically connected a voltage supply line (the Vdd voltage supply line 20 or the Vss voltage supply line 30) positioned on the upper side through the contact plug CT.

For example, in FIG. 5A, the leading end of a branch wire of the Vss voltage supply line 30 and the dummy pattern DM22 are electrically connected with each other through the corresponding contact plug CT. The leading end of another branch wire of the Vss voltage supply line 30 and the dummy pattern DM24 are electrically connected with each other through the corresponding contact plug CT. The leading end of a branch wire of the Vdd voltage supply line 20 and the dummy pattern DM12 are electrically connected with each other through the corresponding contact plug CT. The leading end of another branch wire of the Vdd voltage supply line 20 and the dummy pattern DM14 are electrically connected with each other through the corresponding contact plug CT. The dummy patterns DM11 and DM13 are electrically connected with the Vss voltage supply line 30 through the corresponding contact plugs CT. The dummy patterns DM21 and DM23 are electrically connected with the Vdd voltage supply line 20 through the corresponding contact plugs CT.

In this manner, when each voltage supply line (the Vdd voltage supply line 20 or the Vss voltage supply line 30) are connected with dummy patterns DM, dummy patterns DM to which the voltage Vdd is applied and dummy patterns DM to which the voltage Vss is applied are disposed in a checkered pattern. Accordingly, in the present embodiment, inter-power-source capacitance is generated not only between two dummy patterns DM adjacent to each other in the y direction but also between two dummy patterns DM adjacent to each other in the x direction. Thus, the inter-power-source capacitance is increased by capacitance generated between dummy patterns DM adjacent to each other in the x direction as compared to the comparative example.

For example, in a region R2 surrounded by a dotted line in FIG. 5A, the capacitance C1 is generated between the dummy patterns DM22 and DM12, between the dummy patterns DM22 and DM23, and between the dummy patterns DM12 and DM13, and thus the inter-power-source capacitance is increased by 3×C1 as the whole region R2 due to the dummy patterns DM. In a region R3, the capacitance C1 is generated between the dummy patterns DM23 and DM13 and between the dummy patterns DM23 and DM24, and the capacitance C2 (<C1) is generated between the dummy patterns DM13 and DM14. Thus, the inter-power-source capacitance is increased by 2×C1+C2 as the whole region R2 due to the dummy patterns DM. In the region R1 of the comparative example illustrated in FIG. 4A, increase of the inter-power-source capacitance due to the dummy patterns DM is C1. In other words, with the arrangement of the embodiment, the inter-power-source capacitance due to dummy patterns DM can be increased two to three times larger.

As described above, in the present embodiment, a plurality of dummy patterns DM are disposed in the wiring layer M1 in which the signal lines 10 are provided, and dummy patterns DM adjacent to a signal line 10 are formed in polygonal shapes. Voltage is applied from the Vdd voltage supply line 20 or the Vss voltage supply line 30 laid in the wiring layer M2 different from the wiring layer M1 to each dummy pattern DM through the corresponding contact plug CT. Thus, parasitic capacitance between the signal line 10 and a dummy pattern DM that is adjacent to the signal line 10 and to which the voltage Vss or the voltage Vdd is applied can be reduced while in-plane uniformity of the wiring density in the wiring layer M1 is kept. Since dummy patterns DM adjacent to each other are connected with voltage supply lines different from each other, the inter-power-source capacitance can be increased. Thus, noise tolerance can be improved while signal propagation delay is reduced.

Figure 6A:
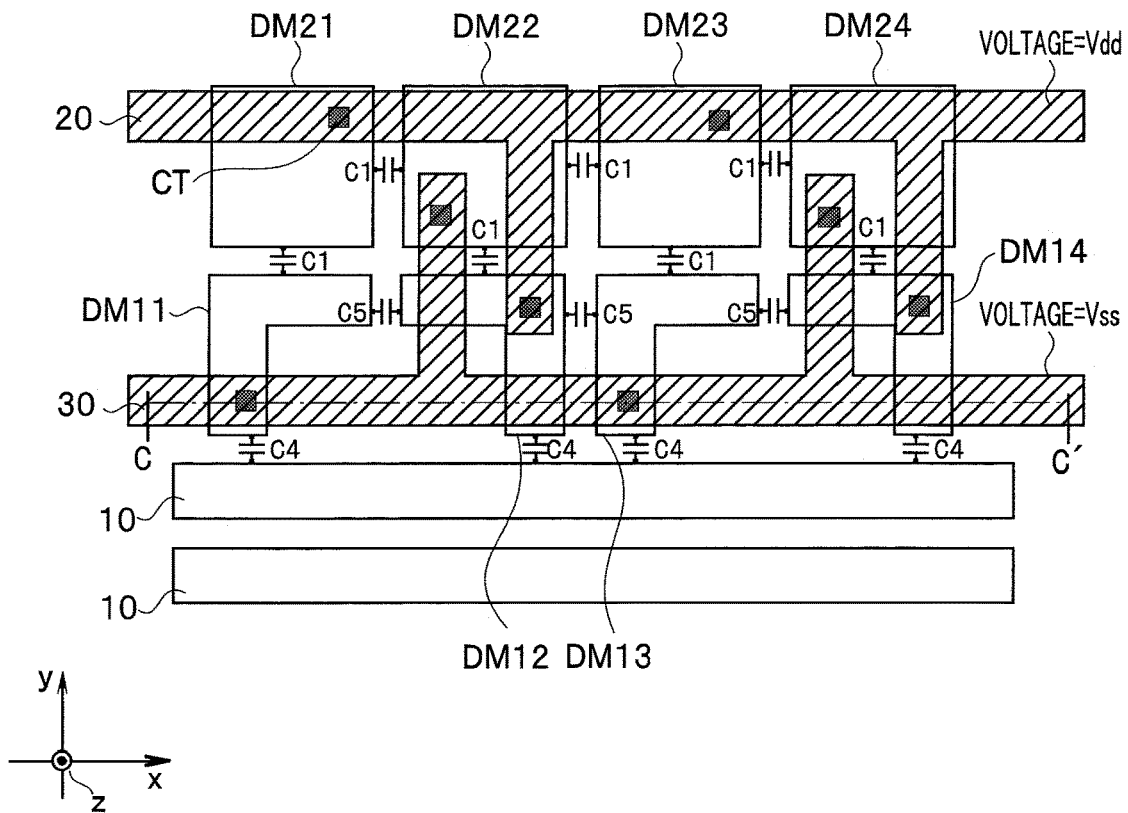
FIG. 6A is a schematic arrangement diagram of dummy patterns and wires according to a first modification of the first embodiment.
Figure 6B:
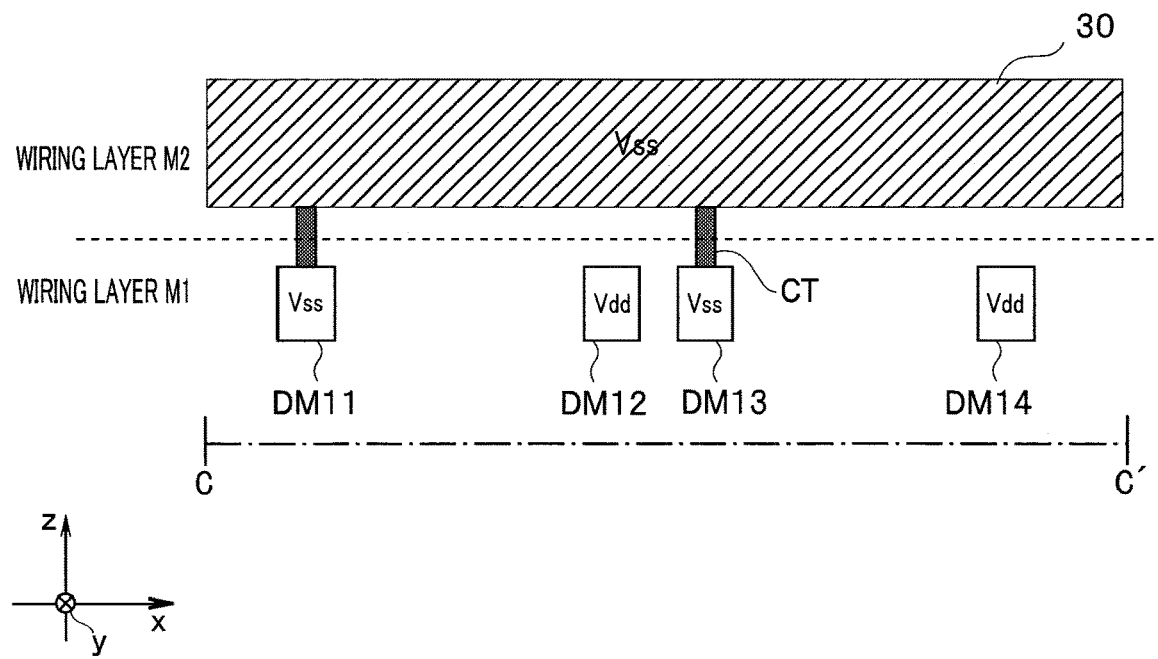
FIG. 6B is a cross-sectional view taken along line C-C' in FIG. 6A.

Subsequently, a first modification of the first embodiment will be described below with reference to FIGS. 6A and 6B. FIG. 6A is a schematic arrangement diagram of dummy patterns and wires according to the first modification of the first embodiment. Specifically, FIG. 6A is a schematic arrangement diagram of the wiring layers M1 and M2 on the xy plane when viewed in the z direction. FIG. 6B is a cross-sectional view taken along line C-C' in FIG. 6A.

The present modification is different from the first embodiment described with reference to FIG. 5A in the shapes of the dummy patterns DM11 to DM14 disposed adjacent to the signal line 10. The other components are same as the components of the first embodiment. In the present modification, sizes of cutout portions of the dummy patterns DM11 to DM14 are larger than sizes of the cutout portions of the dummy patterns DM11 to DM14 of the first embodiment. Specifically, although the length of each side of a cutout portion of the first embodiment is half of the length of each side of the reference square, the length of each side of a cutout portion in the present modification is ⅔ of the length of each side of the reference square. The size of each cutout portion can be increased within a set value (allowable range) of the wiring density, which is provided as a design rule to maintain in-plane uniformity of the wiring density in the wiring layer M1.

As the length of each side of a cutout portion is increased, the area of the end faces of the dummy patterns DM11 to DM14 on the other side in the y direction can be reduced as illustrated in the cross-sectional view in FIG. 6B. In addition, a distance between an end face of each cutout portion in the dummy patterns DM11 to DM14 on the other side in the y direction and the end face of the signal line 10 on the one side in the y direction can be increased. Thus, parasitic capacitance C4 between each of the dummy patterns DM11 to DM14 and the signal line 10 can be made smaller than the parasitic capacitance C2 in the arrangement of the first embodiment.

Figure 7A:
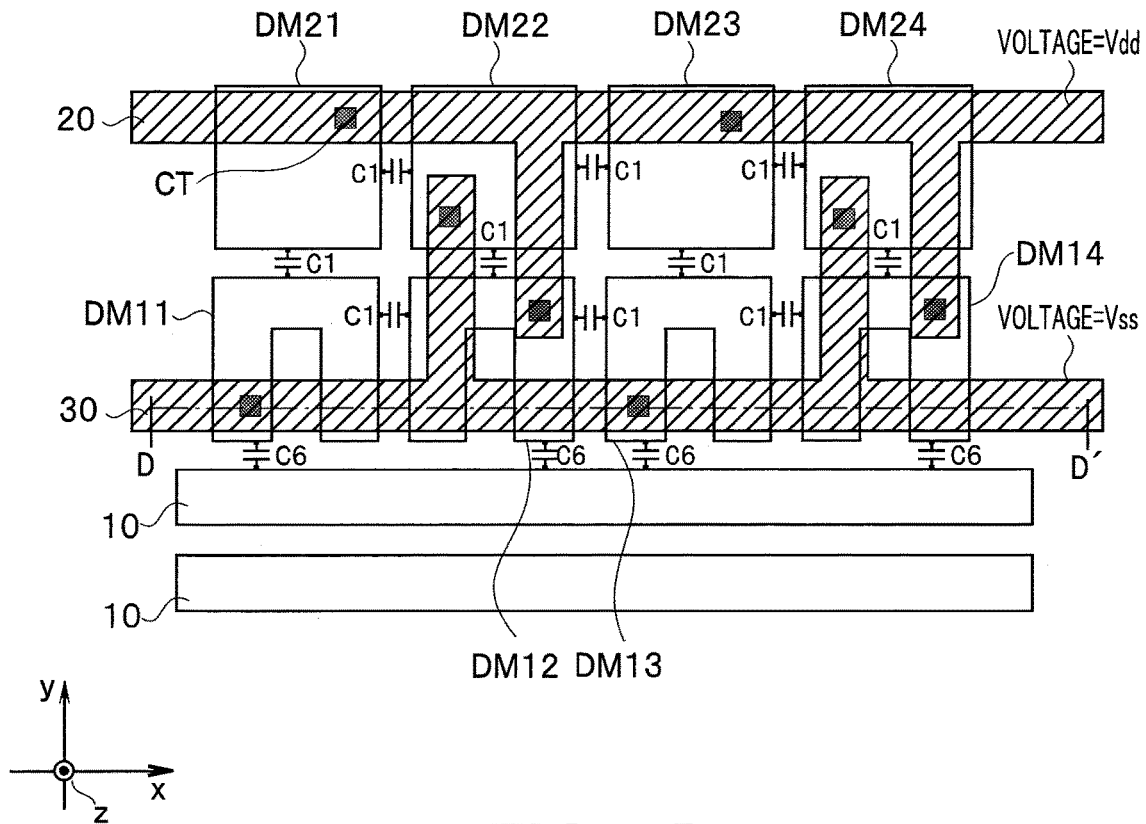
FIG. 7A is a schematic arrangement diagram of dummy patterns and wires according to a second modification of the first embodiment.
Figure 7B:
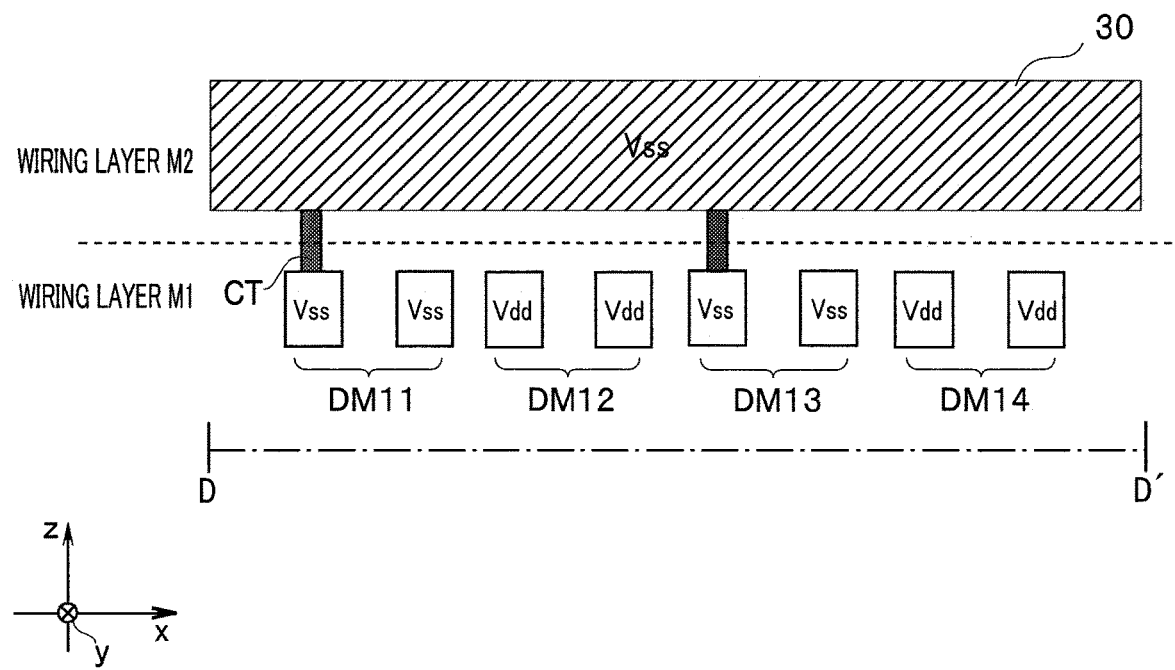
FIG. 7B is a cross-sectional view taken along line D-D' in FIG. 7A.

Subsequently, a second modification of the first embodiment will be described below with reference to FIGS. 7A and 7B. FIG. 7A is a schematic arrangement diagram of dummy patterns and wires according to the second modification of the first embodiment. Specifically, FIG. 7A is a schematic arrangement diagram of the wiring layers M1 and M2 on the xy plane when viewed in the z direction. FIG. 7B is a cross-sectional view taken along line D-D' in FIG. 7A.

The present modification is also different from the first embodiment described with reference to FIG. 5A in the shapes of the dummy patterns DM11 to DM14 disposed adjacent to the signal line 10. Specifically, differences from the first embodiment are that the cutout portions of the dummy patterns DM11 to DM14 have rectangular shapes and the cutout portions are formed at centers of sides of the dummy patterns DM11 to DM14, which face the signal line 10. The other components are same as the components of the first embodiment.

As described above, the size of each cutout portion can be freely set within the set value (allowable range) of the wiring density, which is provided as a design rule to maintain in-plane uniformity of the wiring density in the wiring layer M1. With this configuration, the shape of each cutout portion may be a rectangular shape, lengths of which in the x and y directions are different from each other as illustrated in FIG. 7A. To reduce parasitic capacitance, the cutout portions may be provided at the sides of the dummy patterns DM11 to DM14, which face the signal line 10. With this configuration, the cutout portions may be disposed at central parts of the sides of the dummy patterns DM11 to DM14 on the other side in the y direction as illustrated in FIG. 7A.

With changed positions of the cutout portions in the x direction, the end faces of the dummy patterns DM11 to DM14 on the other side in the y direction are each divided into two rectangular regions as illustrated in the cross-sectional view in FIG. 7B. Parasitic capacitance between each of the end faces of the dummy patterns DM11 to DM14 on the other side in the y direction and the end face of the signal line 10 on the one side in the y direction is determined by a sum of the area of the end faces of the dummy patterns DM11 to DM14 on the other side in the y direction and does not depend on the number of rectangular regions included in the end faces of the dummy patterns DM11 to DM14 on the other side in the y direction. Thus, when cutout portions are provided to the sides of the dummy patterns DM11 to DM14 on the other side in the y direction, parasitic capacitance C6 between each of the dummy patterns DM11 to DM14 and the signal line 10 can be reduced as compared to the parasitic capacitance C1 of the comparative example in which no cutout portions are provided. In addition, since no cutout portions are provided to facing sides of the dummy patterns DM11 to DM14, the inter-power-source capacitance can be increased as compared to the first embodiment.

Second Embodiment

Subsequently, a semiconductor storage device according to a second embodiment will be described below. The semiconductor storage device of the embodiment is different from the semiconductor storage device of the above-described first embodiment in arrangement of the Vdd voltage supply line 20 and the Vss voltage supply line 30. In addition, the contact plug CT in each dummy pattern DM is formed at a position different from the position in the above-described first embodiment. Arrangement (shapes and disposition) of the signal lines 10 and dummy patterns DM is same as the arrangement in the semiconductor storage device of the above-described first embodiment and thus description of this configuration is omitted, and the following description is made only on differences from the first embodiment.

Figure 8:
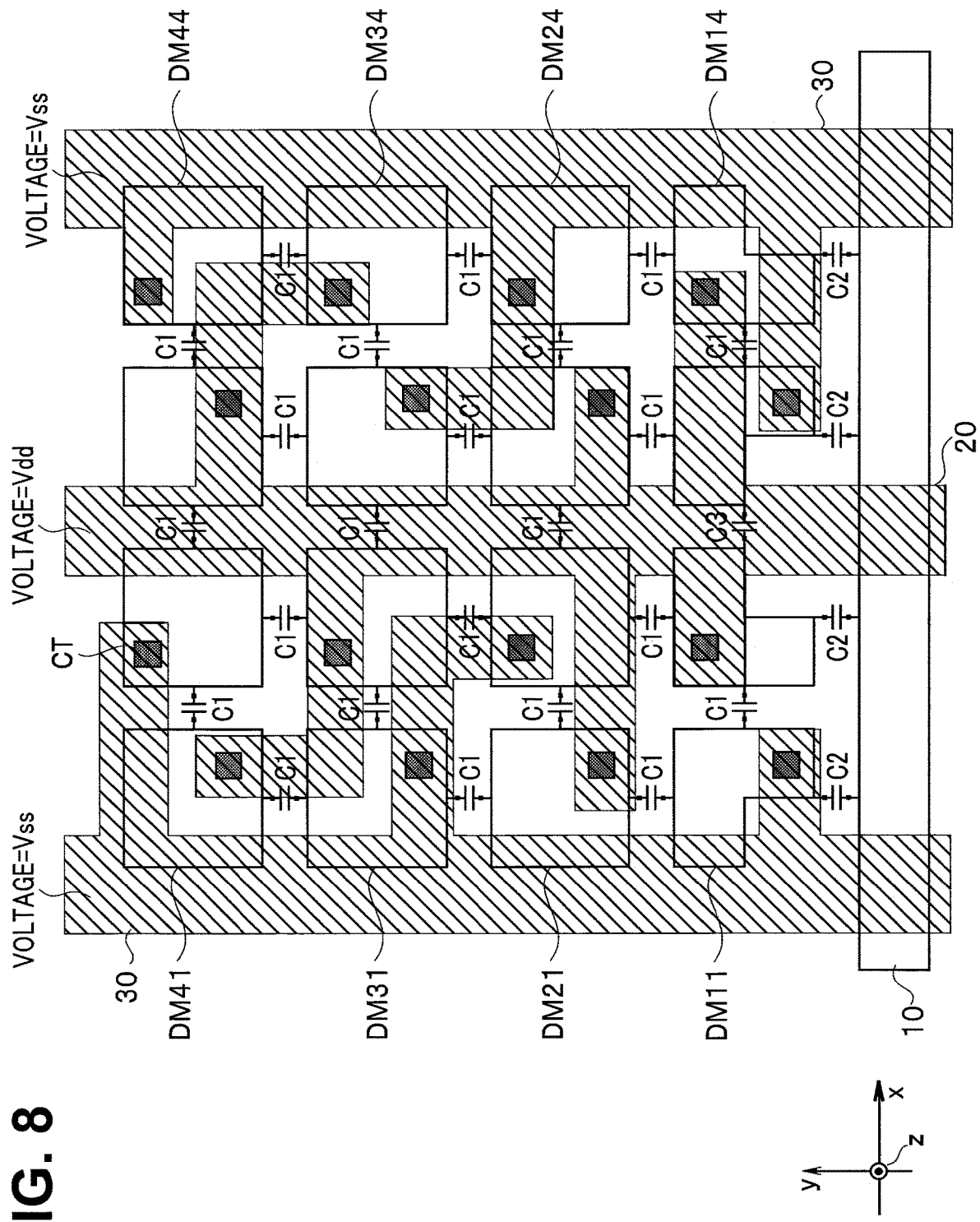
FIG. 8 is a schematic arrangement diagram of dummy patterns and wires according to a second embodiment.

FIG. 8 is a schematic arrangement diagram of dummy patterns and wires according to the second embodiment. In the present embodiment, the trunk wire of the Vdd voltage supply line 20 and the trunk wire of the Vss voltage supply line 30 extend in the y direction. When each dummy pattern DM is divided into two in the x direction and divided into two in the y direction so that a surface of the dummy pattern DM is divided into four regions in total, the contact plug CT of a dummy pattern DM disposed on an odd-numbered column is formed in a region on the one side in the x direction and on the other side in the y direction. The contact plug CT of a dummy pattern DM disposed on an even-numbered column is formed in a region on the other side in the x direction and on the one side in the y direction.

Branch wires extending in the x direction are branched from the trunk wire of the Vdd voltage supply line 20 and the trunk wire of the Vss voltage supply line 30. Each contact plug is connected with the corresponding branch wire of each voltage supply line (the Vdd voltage supply line 20 or the Vss voltage supply line 30) so that dummy patterns DM to which the voltage Vdd is applied and dummy patterns DM to which the voltage Vss is applied are disposed in a checkered pattern. One or more bent parts may be provided halfway through each branch wire to change an extending direction of the branch wire from the x direction to the y direction and from the y direction to the x direction. Alternatively, arrangement in which a plurality of contact plugs CT are connected with one branch wire may be employed.

As described above, according to the present embodiment, when an extending direction of each signal line 10 is different from an extending direction of each voltage supply line (the Vdd voltage supply line 20 or the Vss voltage supply line 30), branch wires are branched from the trunk wire of the voltage supply line, and each contact plug is connected with the corresponding branch wire of the voltage supply line (the Vdd voltage supply line 20 or the Vss voltage supply line 30) so that dummy patterns DM to which the voltage Vdd is applied and dummy patterns DM to which the voltage Vss is applied are disposed in a checkered pattern. Accordingly, in the present embodiment as well, inter-power-source capacitance is generated not only between two dummy patterns DM adjacent to each other in the y direction but also between two dummy patterns DM adjacent to each other in the x direction. Thus, the inter-power-source capacitance is increased by capacitance generated between dummy patterns DM adjacent to each other in the x direction as compared to the comparative example. In addition, since the contact plugs CT are regularly disposed in dummy patterns DM, it is possible to automate pattern disposition of holes (via) opened through an insulating film provided between the wiring layers M1 and M2 for formation of the contact plugs CT.

Figure 9:
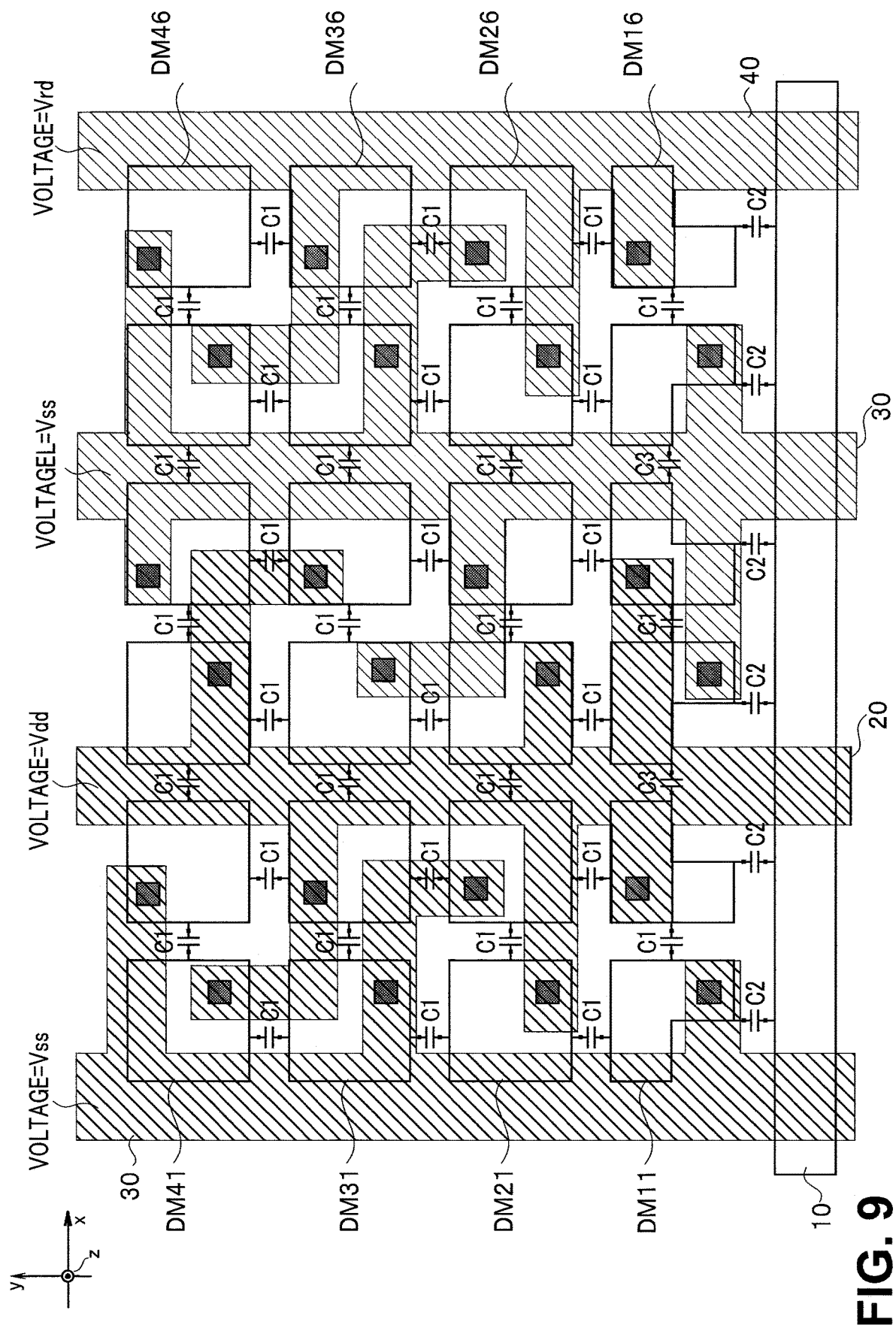
FIG. 9 is a schematic arrangement diagram of dummy patterns and wires according to a modification of the second embodiment.

Subsequently, a modification of the second embodiment will be described below with reference to FIG. 9. FIG. 9 is a schematic arrangement diagram of dummy patterns and wires according to the modification of the second embodiment. The present modification is different from the second embodiment described with reference to FIG. 8 in that a voltage supply line (Vrd voltage supply line 40) of another kind is provided. The other components are same as the components of the second embodiment. Voltage Vrd is, for example, voltage supplied, in operation of reading from a memory cell MT, to a gate electrode of a memory cell MT positioned above the memory cell MT to be read and a gate electrode of a memory cell MT positioned below the memory cell MT to be read.

Similarly to the Vdd voltage supply line 20 and the Vss voltage supply line 30, the Vrd voltage supply line 40 has a shape in which one or more branch wires branched in the x direction are provided halfway through a trunk wire extending in the y direction. In each of dummy patterns DM15, DM16, DM25, DM26, DM35, DM36, DM45, and DM46 on two columns disposed between the Vrd voltage supply line 40 and the adjacent Vss voltage supply line 30, a contact plug CT is connected with a branch wire of a voltage supply line (the Vrd voltage supply line 40 or the Vss voltage supply line 30) so that dummy patterns DM to which the voltage Vrd is applied and dummy patterns DM to which the voltage Vss is applied are disposed in a checkered pattern. Specifically, the contact plugs CT formed in the dummy patterns DM15, DM26, DM35, and DM46 are connected with branch wires of the Vss voltage supply line 30. The contact plugs CT formed in the dummy patterns DM16, DM25, DM36, and DM45 are connected with branch wires of the Vrd voltage supply line 40. One or more bent parts may be provided halfway through each branch wire to change an extending direction of the branch wire from the x direction to the y direction and from the y direction to the x direction. Arrangement in which a plurality of contact plugs CT are connected with one branch wire may be employed.

As described above, when the wiring layer M2 includes the voltage supply lines 20, 30, and 40 of three or more kinds, through which different voltages are supplied, contact plugs are connected with the voltage supply lines 20, 30, and 40 so that dummy patterns DM to which the different voltages are applied are disposed in a checkered pattern. Accordingly, inter-power-source capacitance is generated not only between two dummy patterns DM adjacent to each other in the y direction but also between two dummy patterns DM adjacent to each other in the x direction. Thus, the inter-power-source capacitance is increased by capacitance generated between dummy patterns DM adjacent to each other in the x direction as compared to the comparative example.

Note that, in the present embodiment as well, similarly to the first embodiment, the shapes of dummy patterns DM disposed adjacent to the signal line 10 can be freely set within a set value (allowable range) of the wiring density.

Third Embodiment

A semiconductor storage device according to a third embodiment will be described below. The semiconductor storage device of the embodiment is different from the semiconductor storage device of the above-described second embodiment in arrangement of the Vdd voltage supply line 20 and the Vss voltage supply line 30. In addition, disposition of dummy patterns DM to which the voltage Vdd is applied and dummy patterns DM to which the voltage Vss is applied is different from the disposition in the above-described second embodiment. Arrangement (shapes and disposition) of the signal lines 10 and dummy patterns DM is same as the arrangement in the semiconductor storage devices of the above-described first and second embodiments and thus description of this configuration is omitted, and the following description is made only on differences from the second embodiment.

Figure 10:
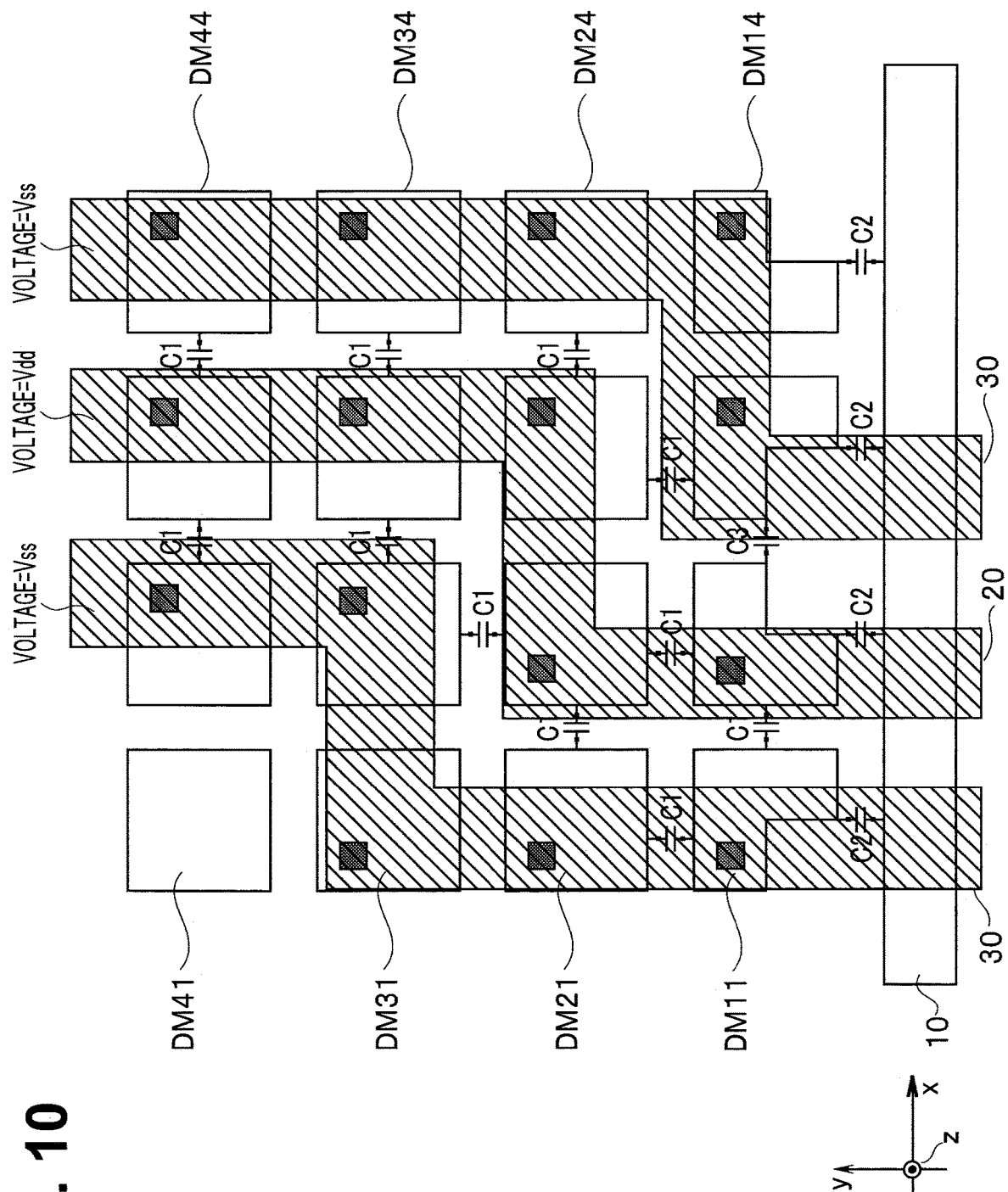
FIG. 10 is a schematic arrangement diagram of dummy patterns and wires according to a third embodiment.

FIG. 10 is a schematic arrangement diagram of dummy patterns and wires according to the third embodiment. The Vdd voltage supply line 20 and the Vss voltage supply line 30 of the present embodiment extend in the y direction above dummy patterns DM on columns adjacent to each other. Each voltage supply line has a crank shape halfway above dummy patterns DM. A part extending in the x direction beyond a first bent part of the crank extends to above a dummy pattern DM adjacent to a dummy pattern DM positioned below the bent part, bends at a second bent part again, and extends in the y direction. The first bent part of the Vdd voltage supply line 20 and the first bent part of the Vss voltage supply line 30 are provided above two dummy patterns DM in contact with each other at corners. For example, in FIG. 10, the first bent part of the Vss voltage supply line 30 is provided above the dummy patterns DM31 and DM13, and the first bent part of the Vdd voltage supply line 20 is provided above the dummy pattern DM22. Each pair of the dummy patterns DM31 and DM22 or the dummy patterns DM22 and DM13 have a positional relation in which the dummy patterns are in contact with each other at corners. The second bent part of the Vss voltage supply line 30 is provided above the dummy patterns DM32 and DM14, and the first bent part of the Vdd voltage supply line 20 is provided above the dummy pattern DM23. Each pair of the dummy patterns DM32 and DM23 or the dummy patterns DM23 and DM14 have a positional relation in which the dummy patterns are in contact with each other at corners.

The Vdd voltage supply line 20 and the Vss voltage supply line 30 are each electrically connected, through contact plugs CT, with dummy patterns DM positioned below a wiring pattern of the voltage supply line. Specifically, according to the present embodiment, dummy patterns DM to which the voltage Vdd is applied are disposed in arrangement same as arrangement of the Vdd voltage supply line 20, and dummy patterns DM to which the voltage Vss is applied are disposed in arrangement same as arrangement of the Vss voltage supply line 30. Thus, when the voltage supply lines 20 and 30 are each shaped in a crank, it is possible to increase the inter-power-source capacitance at a place where a dummy pattern DM to which the voltage Vdd is applied is adjacent to a dummy pattern DM to which the voltage Vss is applied, without forming complicated patterns at the Vdd voltage supply line 20 and the Vss voltage supply line 30.

In addition, in the present embodiment as well, similarly to the first and second embodiments, the dummy patterns DM11 to DM14 adjacent to the signal line 10 are formed in polygonal shapes. Thus, when the voltage Vss or the voltage Vdd is applied to the dummy patterns DM11 to DM14, parasitic capacitance between the signal line 10 and each of the dummy patterns DM11 to DM14 can be reduced.

Figure 11:
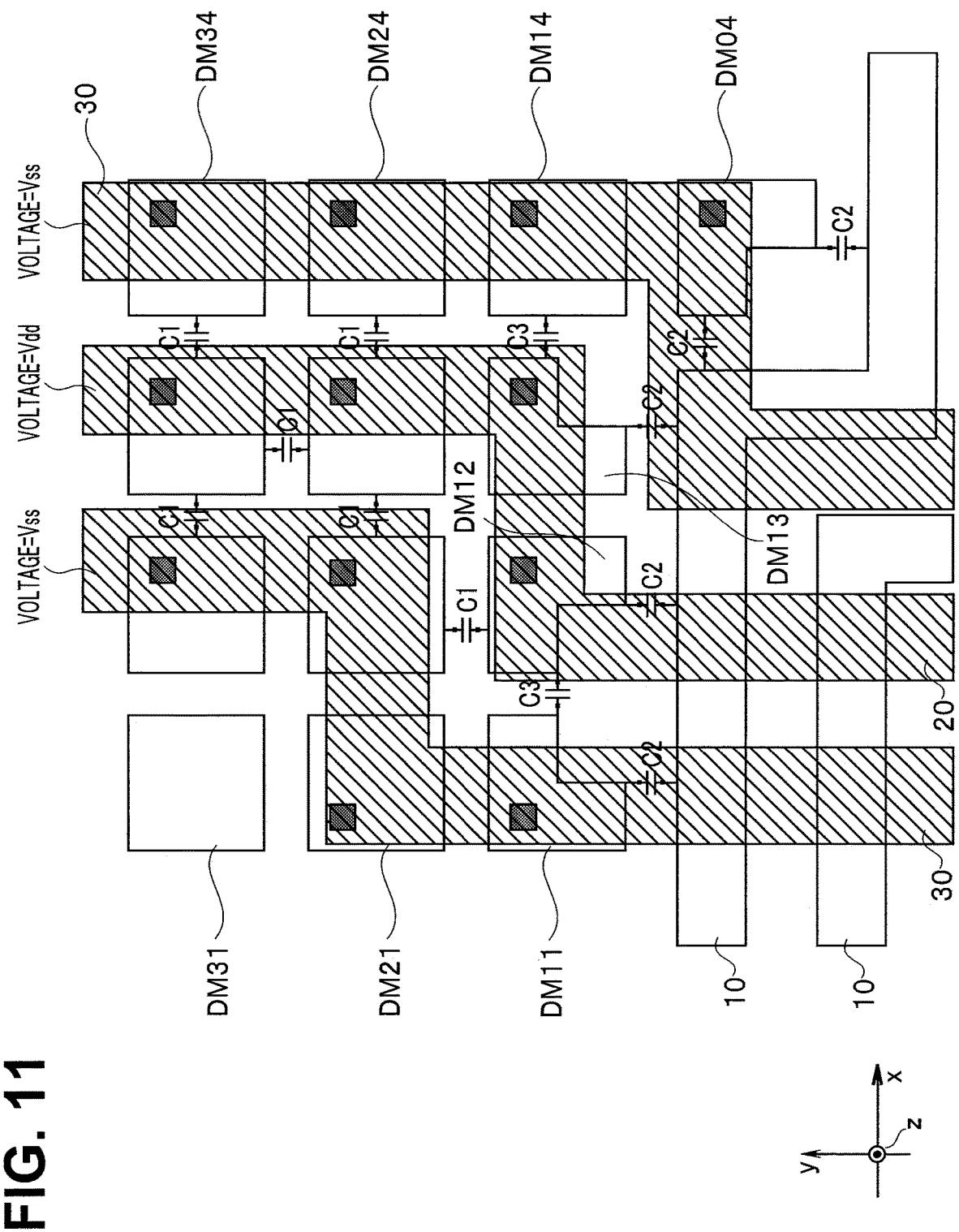
FIG. 11 is a schematic arrangement diagram of dummy patterns and wires according to a modification of the third embodiment.

Subsequently, a modification of the third embodiment will be described below with reference to FIG. 11. FIG. 11 is a schematic arrangement diagram of dummy patterns and wires according to the modification of the third embodiment. The present modification is different from the third embodiment described with reference to FIG. 10 in that not only the voltage supply lines 20 and 30 but also the signal lines 10 are each shaped in a crank. In addition, part of arrangement of dummy patterns DM is different along with arrangement of the signal lines 10.

Each signal line 10 extending in the x direction has a crank shape halfway. At a first bent part, the signal line 10 extends in the y direction. The signal line 10 bends at a second bent part again and extends in the x direction. Similarly to the first embodiment, the dummy patterns DM11 to DM33 are disposed in a matrix on the one side of a wiring part in the y direction, the wiring part extending in the x direction to the first bent part of the signal line 10. In addition, a plurality of dummy patterns DM are disposed at a predetermined interval on the one side of a wiring part in the y direction, the wiring part extending in the x direction from the second bent part. For example, when a length of a side of a dummy pattern DM and a distance to an adjacent dummy pattern are set so that a sum of the length of the side of the dummy pattern DM and the distance to the adjacent dummy pattern is equal to a length of a wire extending in the y direction from the first bent part to the second bent part, 13 dummy patterns DM can be disposed at an equal interval in a matrix in a space not occupied by the signal lines 10 in the wiring layer M1 as illustrated in FIG. 11.

In the present modification, when each signal line 10 is shaped in a crank, the dummy patterns DM11, DM12, DM13, and DM04 disposed adjacent to each other along the signal line 10 are formed in polygonal shapes. Thus, it is possible to reduce parasitic capacitance between the signal line 10 and each dummy pattern DM when the voltage Vss or the voltage Vdd is applied to the dummy pattern DM.

Fourth Embodiment

Subsequently, a semiconductor storage device according to a fourth embodiment of the present invention will be described below. The semiconductor storage device of the embodiment is different from the semiconductor storage device of the above-described first embodiment in that the Vdd voltage supply line 20 and the Vss voltage supply line 30 are formed not only in the wiring layer M2 but also in the wiring layer M0. Arrangement (shapes and disposition) of the signal lines 10 and dummy patterns DM is same as the arrangement in the semiconductor storage device of the above-described first embodiment and thus description of this configuration is omitted, and the following description is made only on differences from the first embodiment.

Figure 12A:
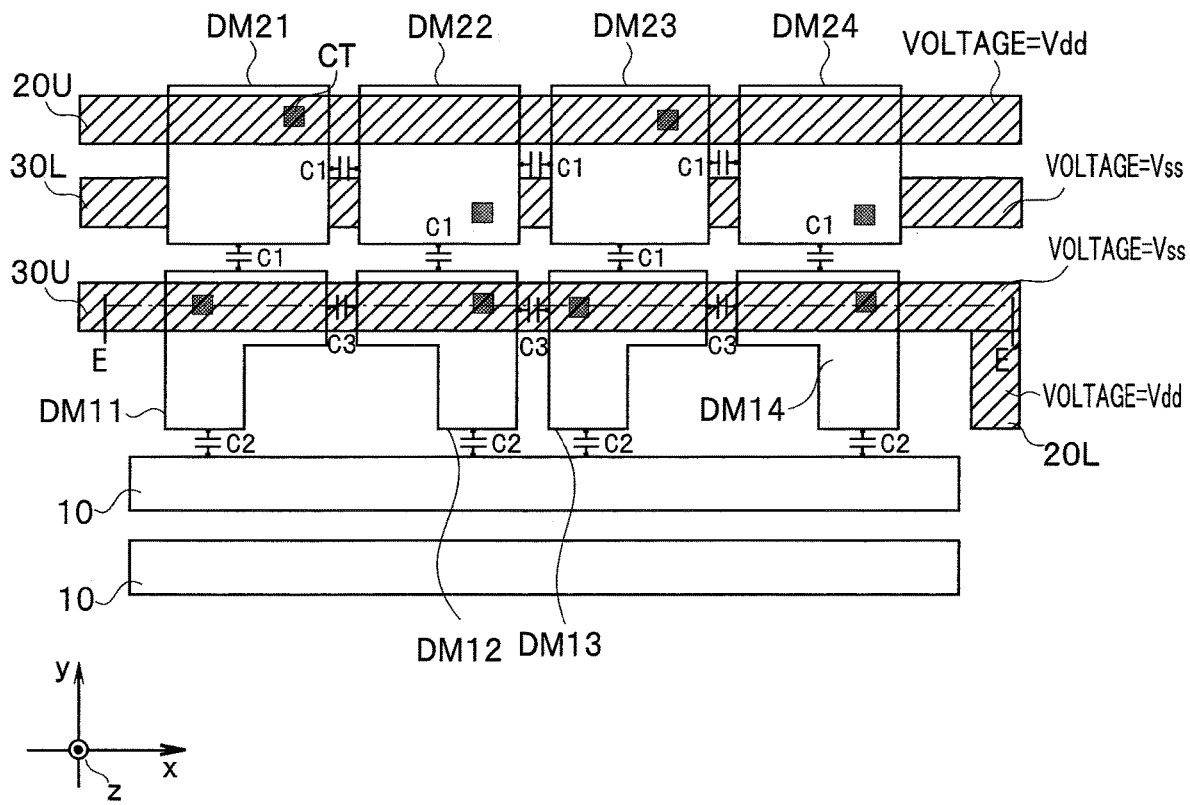
FIG. 12A is a schematic arrangement diagram of dummy patterns and wires according to a fourth embodiment.
Figure 12B:
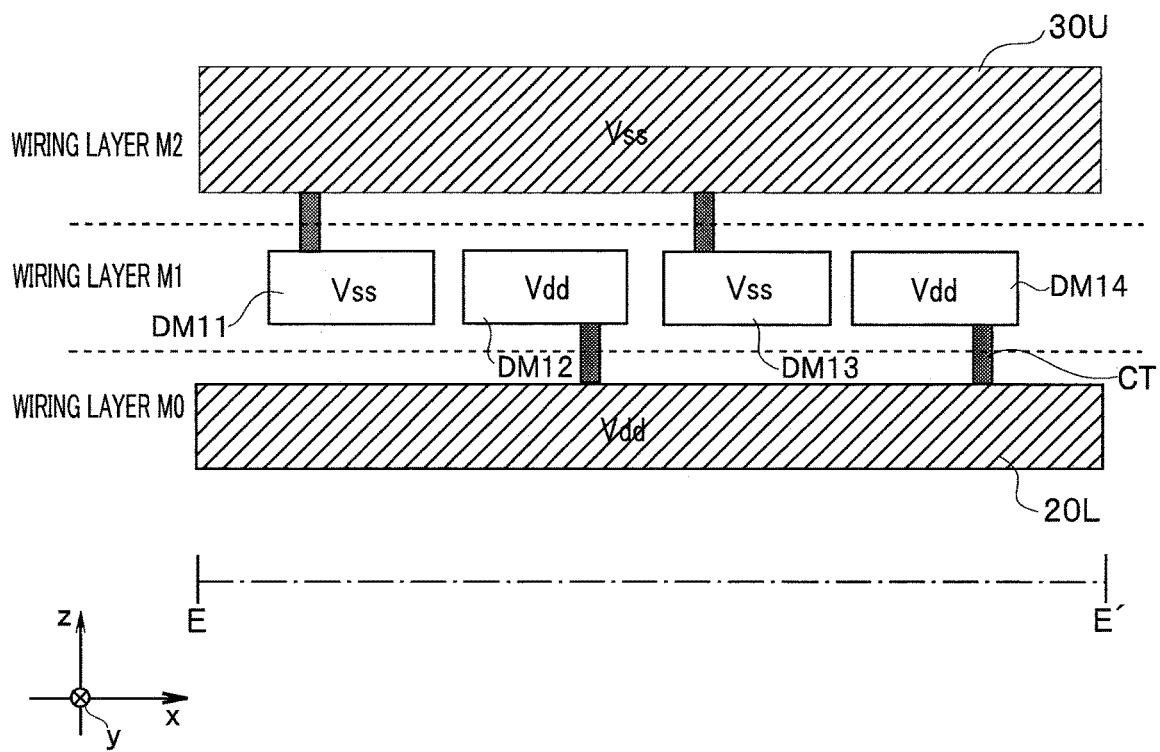
FIG. 12B is a cross-sectional view taken along line E-E' in FIG. 12A.

FIG. 12A is a schematic arrangement diagram of dummy patterns and wires according to the fourth embodiment. FIG. 12B is a cross-sectional view taken along line E-E' in FIG. 12A. As illustrated in FIG. 12A, in the present embodiment, the Vdd voltage supply line 20 and the Vss voltage supply line 30 are laid in each of the two wiring layers M2 and M0. A Vdd voltage supply line 20U and a Vss voltage supply line 30U laid in the wiring layer M2 are same as in the first embodiment illustrated in FIG. 5A. A Vdd voltage supply line 20L and a Vss voltage supply line 30L laid in the wiring layer M0 are provided for, for example, routing of a power supply line provided in the wiring layer M2. The Vdd voltage supply line 20L and the Vss voltage supply line 30L extend in the x direction. The Vss voltage supply line 30L is provided below the dummy patterns DM21 to DM24 on the second row positioned below the Vdd voltage supply line 20U. The Vdd voltage supply line 20L is provided below the dummy patterns DM11 to DM14 on the first row positioned below the Vss voltage supply line 30U.

As illustrated in FIG. 12B, the dummy patterns DM11 and DM13 positioned on an odd-numbered row and an odd-numbered column are electrically connected with the Vss voltage supply line 30U provided in the wiring layer M2 through contact plugs CT. The dummy patterns DM12 and DM14 positioned on the odd-numbered row and an even-numbered column are electrically connected with the Vdd voltage supply line 20L provided in the wiring layer M0 through contact plugs CT. With this configuration, voltage applied to the dummy patterns DM11 to DM14 disposed on the first row is same as in the first embodiment illustrated in FIG. 5B, but the voltage supply lines 20 and 30 from which the voltage is applied are laid in different wiring layers. The wiring layer M1 and a correlation insulating film are provided between the Vdd voltage supply line 20L provided in the wiring layer M0 and the Vss voltage supply line 30U provided in the wiring layer M2, and thus no inter-wire capacitance is generated between the voltage supply lines. However, according to the present embodiment, since such arrangement is employed in which a dummy pattern DM electrically connected with the Vss voltage supply line 30U provided in the wiring layer M2 is disposed adjacent to a dummy pattern DM electrically connected with the Vdd voltage supply line 20L provided in the wiring layer M0, inter-wire capacitance can be generated between two voltage supply lines that are provided in the different wiring layers and to which different voltages are supplied. Thus, further power source enhancement can be achieved.

Note that, in the present embodiment as well, similarly to the first embodiment, the dummy patterns DM11 to DM14 adjacent to a signal line 10 are each formed in polygonal shapes. Thus, when the voltage Vss or the voltage Vdd is applied to the dummy patterns DM11 to DM14, parasitic capacitance between the signal line 10 and each of the dummy patterns DM11 to DM14 can be reduced.

Fifth Embodiment

Figure 13A:
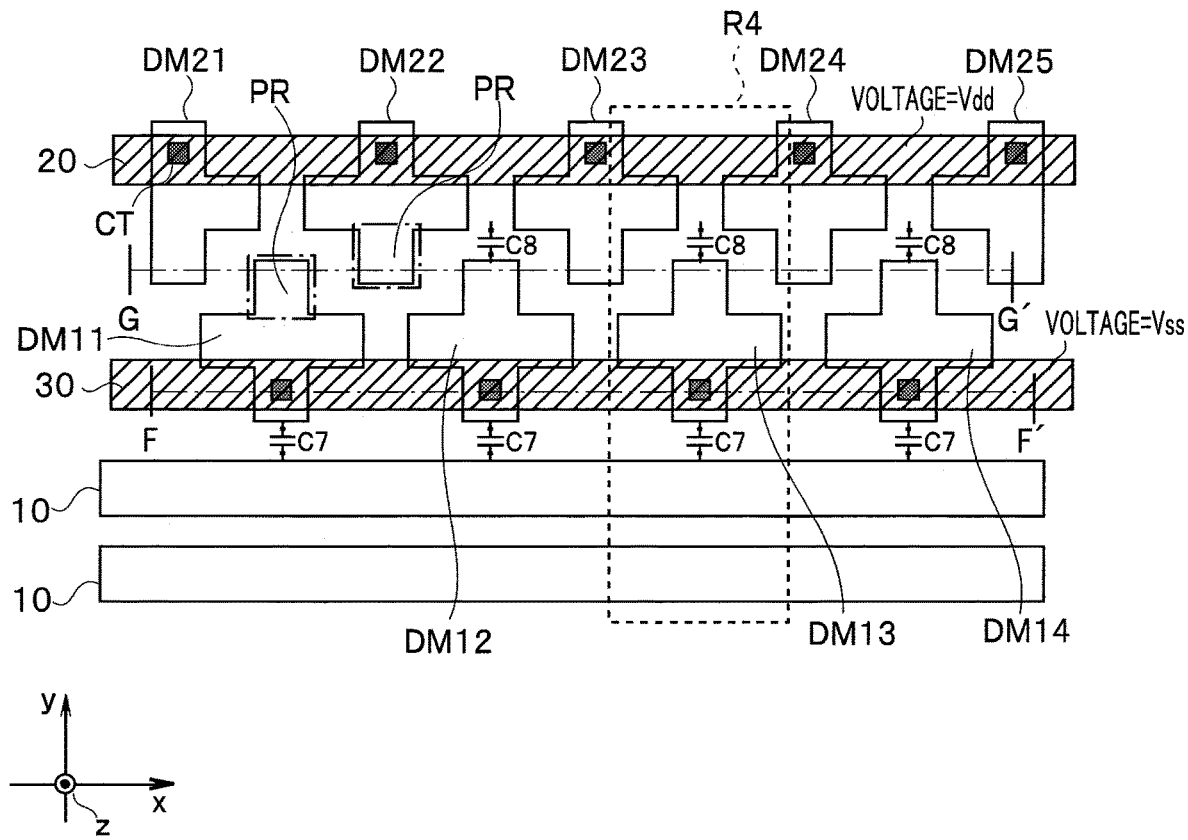
FIG. 13A is a schematic arrangement diagram of dummy patterns and wires according to a fifth embodiment.
Figure 13B:
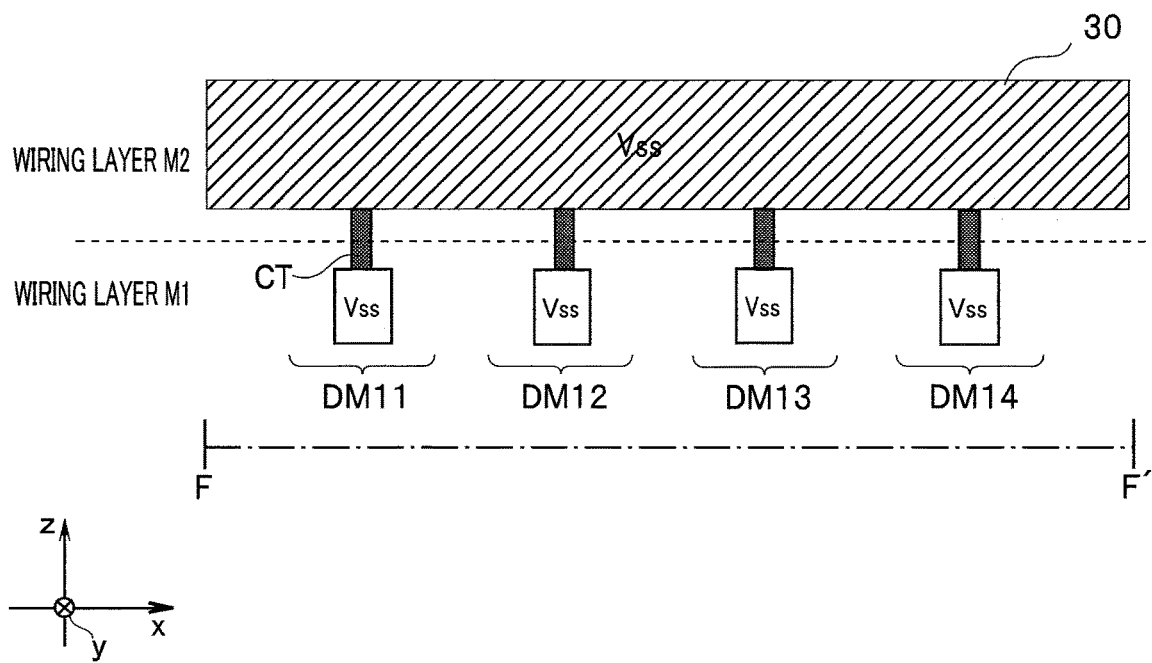
FIG. 13B is a cross-sectional view taken along line F-F' in FIG. 13A.

Subsequently, a semiconductor storage device according to a fifth embodiment of the present invention will be described below. The semiconductor storage device of the embodiment is different from the semiconductor storage device of the first embodiment in arrangement (shapes and disposition) of dummy patterns DM. The other components are same as the components of the semiconductor storage device of the above-described first embodiment and thus description of this configuration is omitted, and the following description is made only on differences from the first embodiment. FIG. 13A is a schematic arrangement diagram of dummy patterns and wires according to the fifth embodiment. FIG. 13B is a cross-sectional view taken along line F-F' in FIG. 13A.

In the present embodiment, not only the dummy patterns DM11 to DM14 adjacent to a signal line 10 but also other dummy patterns DM21 to DM25 disposed in the wiring layer M1 have polygonal shapes. Each dummy pattern DM of the embodiment has, for example, a cross shape in which a square cutout portion having sides of a length equal to $1/3$ of the length of each side of the reference square is formed at one corner of the reference square as illustrated in FIG. 13A. The Vss voltage supply line 30 extending in the x direction is disposed above the dummy patterns DM11 to DM14 on the first row. The dummy patterns DM11 to DM14 are each electrically connected with the Vss voltage supply line 30 through a contact plug CT. Accordingly, the voltage Vss is applied to the dummy patterns DM11 to DM14. The Vdd voltage supply line 20 extending in the x direction is disposed above the dummy patterns DM21 to DM25 on the second row. The dummy patterns DM21 to DM25 are each electrically connected with the Vdd voltage supply line 20 through a contact plug CT. Accordingly, the voltage Vdd is applied to the dummy patterns DM21 to DM24.

The dummy patterns DM21 to DM25 on the second row are shifted on the other side in the x direction with respect to the dummy patterns DM11 to DM14 on the first row. Specifically, the dummy pattern DM22 is disposed between the dummy patterns DM11 and DM12 on the one side of the dummy patterns in the y direction, and the dummy pattern DM23 is disposed between the dummy patterns DM12 and DM13 on the one side of the dummy patterns in the y direction. A protrusion part PR of each of the dummy patterns DM21 to DM25 on the second row on the other side in the y direction is disposed as a protrusion in a region (concave region) that includes cutout portions facing each other and provided to two dummy patterns DM adjacent to each other on the first row and includes a region between the two cutout portions. Specifically, a protrusion part PR of each dummy pattern DM on the first row on the one side in the y direction and a protrusion part PR of each dummy pattern DM on the second row on the other side in the y direction are alternately disposed along line G-G' in FIG. 13A. With this disposition, a distance between a dummy pattern DM on the first row and the corresponding dummy pattern DM on the second row can be reduced as compared to a case of disposition in a matrix, and inter-power-source capacitance C8 can be ensured. In addition, since the protrusion part PR of a dummy pattern DM is arranged as a protrusion in the concave region, the wiring density can be increased, which contributes to improvement of in-plane uniformity in CMP fabrication.

Note that, in each of the dummy patterns DM11 to DM14 of the embodiment, two cutout portions are provided on a side facing the signal line 10, and a length of a side nearest to the signal line 10 is $1/3$ of the length of each side of the reference square as illustrated in FIG. 13B. Parasitic capacitance C7 between each of the dummy patterns DM11 to DM14 and the signal line 10 is equivalent to the parasitic capacitance C4 in the first modification of the first embodiment illustrated in FIG. 6B.

Sixth Embodiment

Subsequently, a semiconductor storage device according to a sixth embodiment of the present invention will be described below. The semiconductor storage device of the embodiment is different from the first to fifth embodiments in that dummy patterns DM are shaped in a comb teeth shape. The following description is made only on differences from the first embodiment.

Figure 14:
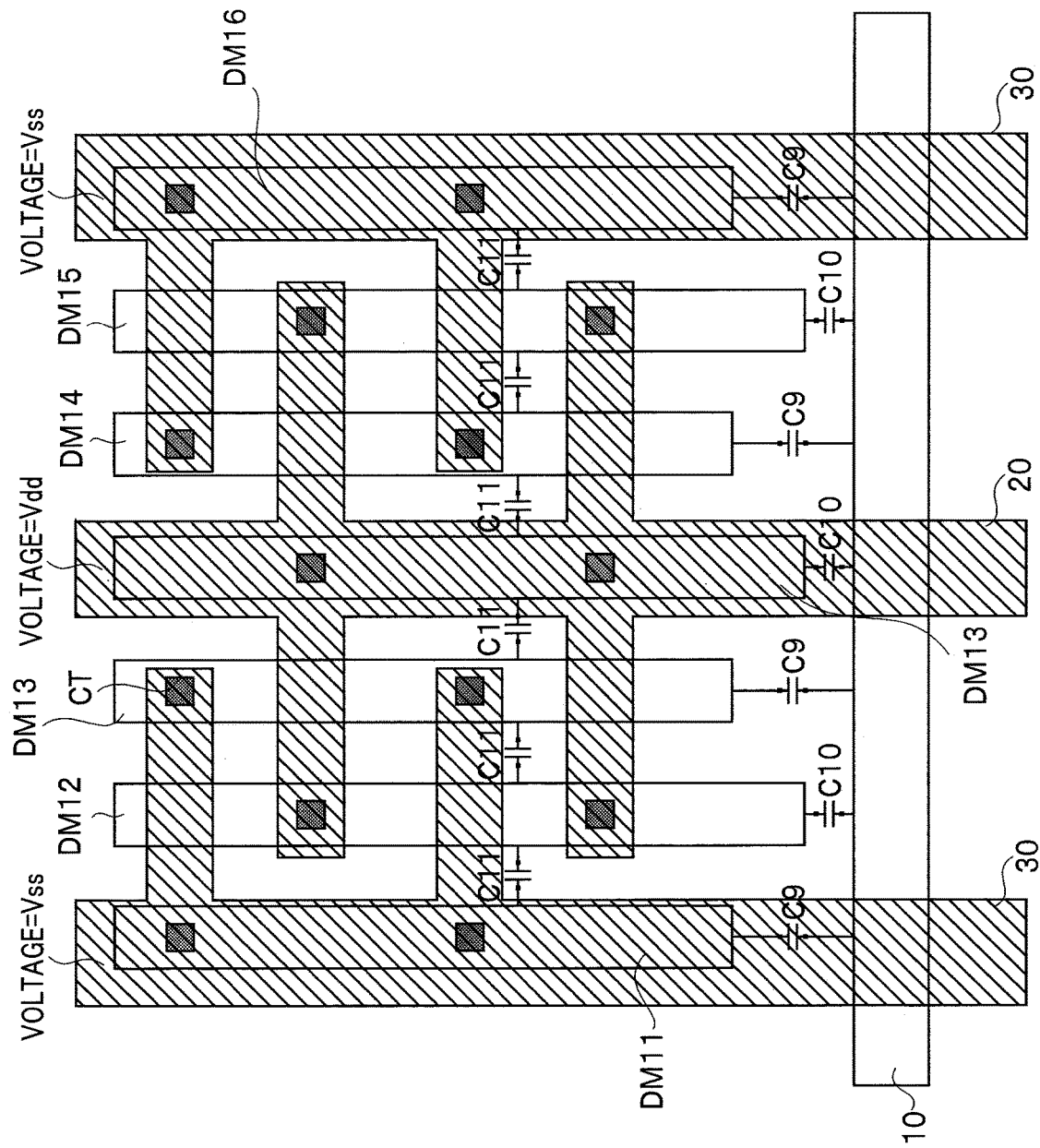
FIG. 14 is a schematic arrangement diagram of dummy patterns and wires according to a sixth embodiment.

FIG. 14 is a schematic arrangement diagram of dummy patterns and wires according to the sixth embodiment. In the present embodiment, the trunk wire of the Vdd voltage supply line 20 and the trunk wire of the Vss voltage supply line 30 extend in the y direction. The dummy patterns DM11 to DM16 in a comb teeth shape extending in the y direction are disposed at a constant interval in the x direction.

Branch wires extending in the x direction are branched from the trunk wire of the Vdd voltage supply line 20 and the trunk wire of the Vss voltage supply line 30. Each dummy pattern DM is electrically connected with a voltage supply line (the Vdd voltage supply line 20 or the Vss voltage supply line 30) through a contact plug CT so that each dummy pattern DM to which the voltage Vdd is applied and each dummy pattern DM to which the voltage Vss is applied are alternately arranged in the x direction. Specifically, the voltage Vss is applied from the Vss voltage supply line 30 to the dummy patterns DM11, DM13, and DM15 on odd-numbered columns. The voltage Vdd is applied from the Vdd voltage supply line 20 to the dummy patterns DM12, DM14, and DM16 on even-numbered columns. Each contact plug CT may be provided to a trunk wire or a branch wire. One or more bent parts may be provided halfway through each branch wire to change the extending direction of the branch wire from the x direction to the y direction and from the y direction to the x direction. Alternatively, arrangement in which a plurality of contact plugs CT are connected with one branch wire may be employed. With this arrangement, inter-power-source capacitance C11 is generated between facing sides of dummy patterns DM adjacent to each other. The inter-power-source capacitance can be increased by increasing a length of a long side of each dummy pattern DM extending in the y direction.

As illustrated in FIG. 14, a distance between a leading end of each dummy pattern DM on the other side in the y direction and the signal line 10 may be different or equal between the dummy patterns DM11, DM13, and DM15 on the odd-numbered columns and the dummy patterns DM12, DM14, and DM16 on the even-numbered columns. Parasitic capacitance C9 and C10, which is generated in accordance with the distance between the leading end of each dummy pattern DM on the other side in the y direction and the signal line 10, can be reduced by adjusting the distance and the number of dummy patterns DM.

As described above, even when dummy patterns DM are in a shape such as a comb teeth shape, other than a polygonal shape, it is possible to reduce parasitic capacitance between each dummy pattern DM and the signal line 10 and increase inter-power-source voltage.

Figure 15:
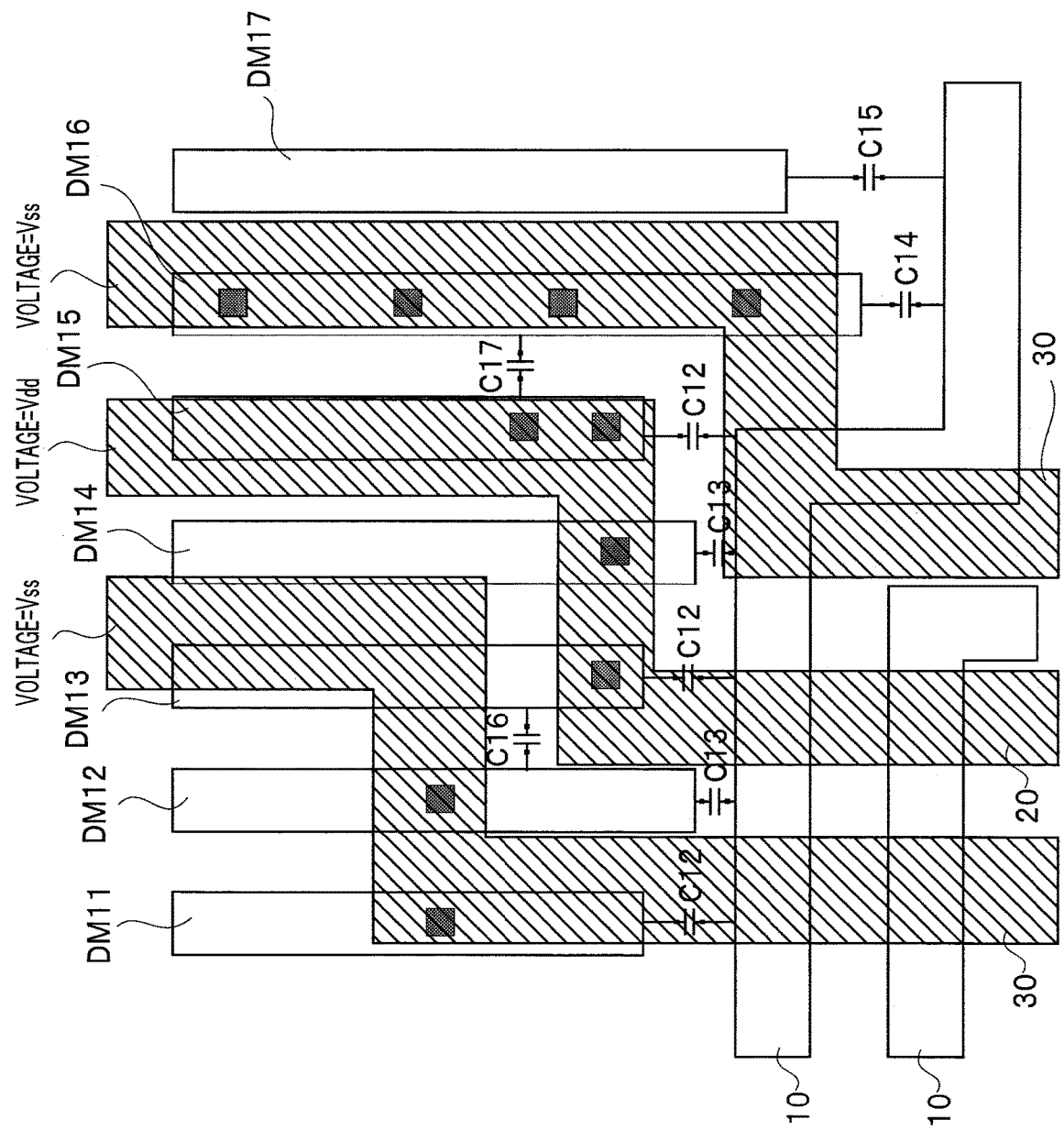
FIG. 15 is a schematic arrangement diagram of dummy patterns and wires according to a first modification of the sixth embodiment.

Note that the above-described arrangement (shape, disposition) of dummy patterns DM is also applicable to a case in which the signal line 10, the Vdd voltage supply line 20, and the Vss voltage supply line 30 are each shaped in a crank. FIG. 15 is a schematic arrangement diagram of dummy patterns and wires according to a first modification of the sixth embodiment. When the Vdd voltage supply line 20 and the Vss voltage supply line 30 are each shaped in a crank, it is sometimes difficult to arrange the Vdd voltage supply line 20, the Vss voltage supply line 30, and contact plugs CT so that voltages different from each other are applied to adjacent dummy patterns DM. In such a case, arrangement is applicable in which the same voltage is applied to a plurality of adjacent dummy patterns DM as illustrated in FIG. 15. When voltages different from each other are applied to the adjacent dummy patterns DM, inter-power-source capacitance C16 and C17 is generated in accordance with a length of facing sides of the dummy patterns DM.

As illustrated in FIG. 15, the length of each dummy pattern DM is adjusted in accordance with the distance to the signal line 10. A distance from the signal line 10 to each adjacent dummy pattern DM may be changed between a partial wire extending on the other side in the x direction from a bent part on the one side in the y direction among two bent parts provided to the signal line 10, and a partial wire extending on the one side in the y direction from a bent part on the other side in the y direction. For example, the distance between the partial wire extending on the one side in the y direction and the dummy pattern DM may be shorter than the distance between the partial wire extending on the other side in the y direction and the dummy pattern DM as illustrated in FIG. 15. With this arrangement, parasitic capacitance C12, C13, C14, or C15, which is generated between each dummy pattern DM and the signal line 10, can be reduced by adjusting the distance and the number of dummy patterns DM.

Figure 16:
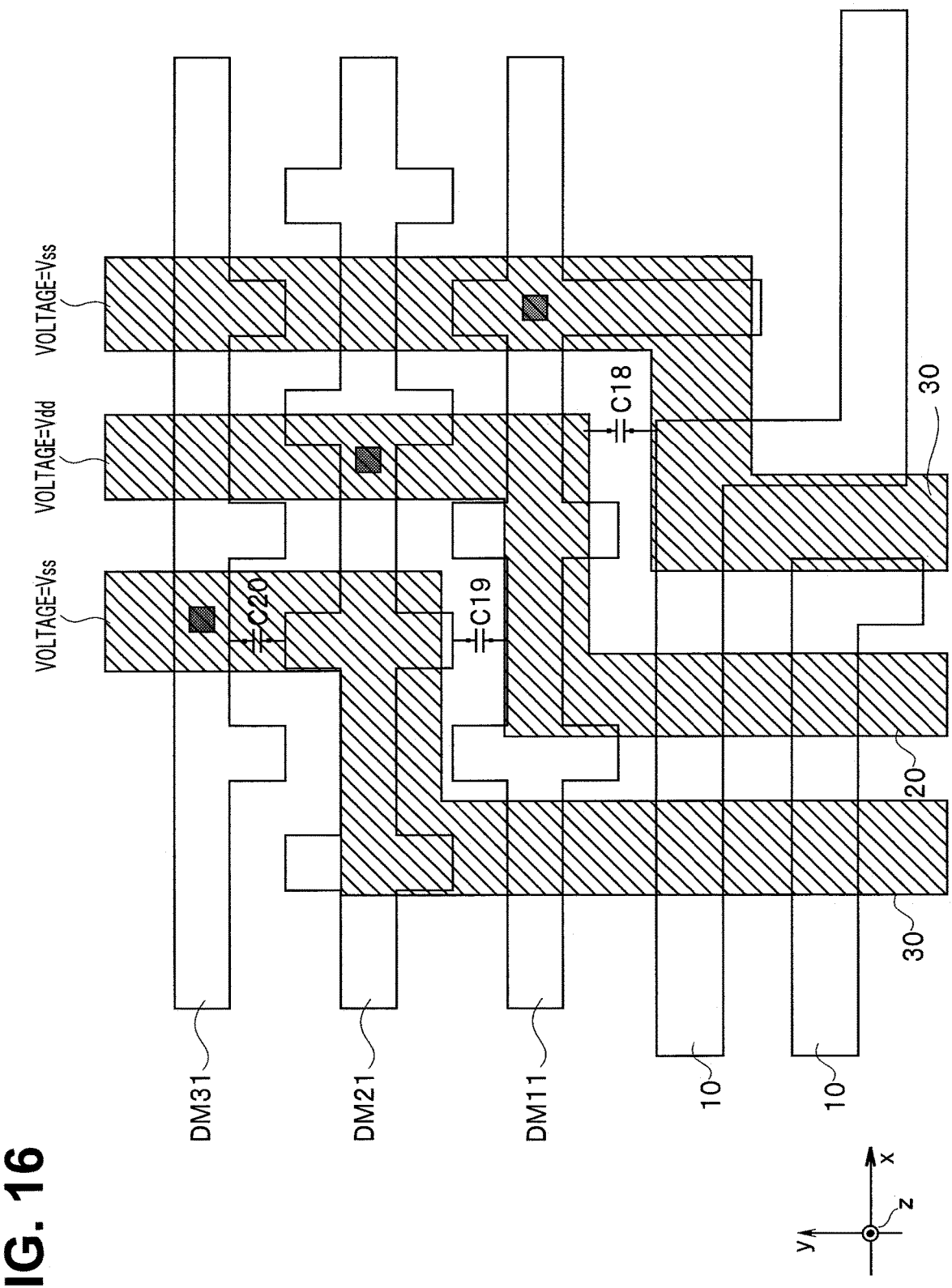
FIG. 16 is a schematic arrangement diagram of dummy patterns and wires according to a second modification of the sixth embodiment.

FIG. 16 is a schematic arrangement diagram of dummy patterns and wires according to a second modification of the sixth embodiment. The present modification is different from the first modification illustrated in FIG. 15 in that each dummy pattern DM has a shape including a branch part halfway through a comb teeth and a comb teeth part of the dummy pattern DM extends in parallel to the direction (x direction) in which the signal line 10 extends. In other words, each dummy pattern DM of the present modification is arranged so that both protrusion parts of a cross-shaped dummy pattern DM of the fifth embodiment illustrated in FIG. 13A in the x direction are extended to connect dummy patterns adjacent to each other in a row direction, thereby forming one dummy pattern DM per row. In this manner, when branch parts (protrusion parts in the y direction) are formed halfway through the comb teeth, lengths of facing sides of dummy patterns DM adjacent to each other can be increased, and thus inter-power-source capacitance C20 can be increased. Thus, noise tolerance can be further improved.

While certain embodiments have been described, these embodiments have been presented by way of example only, and are not intended to limit the scope of the inventions. Indeed, the novel devices and systems described herein may be embodied in a variety of other forms; furthermore, various omissions, substitutions and changes in the form of the devices and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising a first wiring layer and a second wiring layer, wherein
the first wiring layer includes a signal line through which a data signal is transferred and a plurality of dummy patterns formed of a material same as a material of the signal line,
the second wiring layer includes a first voltage supply line through which first voltage is supplied and a second voltage supply line through which second voltage different from the first voltage is supplied,
each of the dummy patterns is electrically connected with any one of the first voltage supply line and the second voltage supply line,
in an adjacent dummy pattern that is one of the dummy patterns and disposed adjacent to the signal line, a surface facing the signal line is constituted by a first surface positioned at a first distance to the signal line and a second surface positioned at a second distance to the signal line, the second distance being different from the first distance,
the first voltage supply line includes
a first trunk wire extending in a first direction, and
a first branch wire that is branched from the first trunk wire and at least part of which extends in a second direction intersecting the first direction,
the second voltage supply line includes
a second trunk wire extending in the first direction, and
a second branch wire that is branched from the second trunk wire and at least part of which extends in the second direction,
the plurality of dummy patterns include
a first dummy pattern electrically connected with the first voltage supply line,
a second dummy pattern electrically connected with the first voltage supply line,
a third dummy pattern electrically connected with the second voltage supply line, and
a fourth dummy pattern electrically connected with the second voltage supply line,
the first dummy pattern and the fourth dummy pattern face each other in the first direction, the third dummy pattern and the second dummy pattern face each other in the first direction, the first dummy pattern and the third dummy pattern face each other in the second direction, and the fourth dummy pattern and the second dummy pattern face each other in the second direction.

2. The semiconductor storage device according to claim 1, wherein the adjacent dummy pattern has a polygonal shape including a cutout portion at part of a rectangle.

3. The semiconductor storage device according to claim 2, wherein the plurality of dummy patterns are disposed in a matrix, a dummy pattern adjacent to the dummy pattern electrically connected with the first voltage supply line is electrically connected with the second voltage supply line, and a dummy pattern adjacent to a second dummy pattern electrically connected with the second voltage supply line is electrically connected with the first voltage supply line.

4. The semiconductor storage device according to claim 2, wherein the dummy pattern electrically connected with any one of the first voltage supply line and the second voltage supply line has a polygonal shape.

5. The semiconductor storage device according to claim 1, wherein the signal line extends in the first direction, the first trunk wire of the first voltage supply line is disposed separately from the signal line in the second direction, the second trunk wire of the second voltage supply line is disposed between the first voltage supply line and the signal line in the second direction, the first dummy pattern is electrically connected with the first trunk wire of the first voltage supply line, the second dummy pattern is electrically connected with the first branch wire of the first voltage supply line, the third dummy pattern is electrically connected with the second trunk wire of the second voltage supply line, the fourth dummy pattern is electrically connected with the second branch wire of the second voltage supply line, the first dummy pattern and the fourth dummy pattern each have a rectangular shape, and the third dummy pattern and the second dummy pattern each have a polygonal shape including a cutout portion at part of a rectangle.

6. The semiconductor storage device according to claim 5, wherein the third dummy pattern and the second dummy pattern are line-symmetric to each other with respect to the second direction when viewed in a third direction intersecting the first direction and the second direction.

7. The semiconductor storage device according to claim 1, wherein the signal line extends in the second direction, the first trunk wire of the first voltage supply line intersects the signal line when viewed in a third direction intersecting the first direction and the second direction, the second trunk wire of the second voltage supply line intersects the signal line when viewed in the third direction, the first voltage supply line further includes a third branch wire, at least part of which extends in the second direction, the second voltage supply line further includes a fourth branch wire, at least part of which extends in the second direction, the first dummy pattern is electrically connected with the first trunk wire of the first voltage supply line trunk wire, the second dummy pattern is electrically connected with the third branch wire of the first voltage supply line, the third dummy pattern is electrically connected with the second trunk wire of the second voltage supply line, the fourth dummy pattern is electrically connected with the second branch wire of the second voltage supply line, the first dummy pattern and the third dummy pattern each have a rectangular shape, and the second dummy pattern and the fourth dummy pattern each have a polygonal shape including a cutout portion at part of a rectangle.

8. The semiconductor storage device according to claim 7, wherein the second dummy pattern and the fourth dummy pattern are line-symmetric to each other with respect to the first direction when viewed in the third direction.

\* \* \* \* \*